(12) United States Patent
D'Evelyn et al.

(10) Patent No.: US 8,455,894 B1
(45) Date of Patent: Jun. 4, 2013

(54) PHOTONIC-CRYSTAL LIGHT EMITTING DIODE AND METHOD OF MANUFACTURE

(75) Inventors: Mark P. D'Evelyn, Goleta, CA (US); Rajat Sharma, Goleta, CA (US); Eric M. Hall, Goleta, CA (US)

(73) Assignee: SORAA, Inc., Fremont, CA (US)

( * ) Notice: Subject to any disclaimer, the term of this patent is extended or adjusted under 35 U.S.C. 154(b) by 347 days.

(21) Appl. No.: 12/569,844

(22) Filed: Sep. 29, 2009

Related U.S. Application Data

(60) Provisional application No. 61/106,159, filed on Oct. 17, 2008.

(51) Int. Cl.
  *H01L 33/02* (2010.01)
(52) U.S. Cl.
  USPC ............................... 257/98; 257/E33.068
(58) Field of Classification Search
  USPC ................................ 257/94, 98, E33.068
  See application file for complete search history.

(56) References Cited

U.S. PATENT DOCUMENTS

| | | | |
|---|---|---|---|
| 3,245,760 A | 4/1966 | Sawyer | |
| 3,303,053 A | 2/1967 | Strong et al. | |
| 3,335,084 A | 8/1967 | Hall | |
| 4,030,966 A | 6/1977 | Hornig et al. | |
| 4,430,051 A | 2/1984 | Von Platen | |
| 5,868,837 A | 2/1999 | DiSalvo et al. | |
| 6,090,202 A | 7/2000 | Klipov | |
| 6,129,900 A | 10/2000 | Satoh et al. | |
| 6,152,977 A | 11/2000 | D'Evelyn | |
| 6,350,191 B1 | 2/2002 | D'Evelyn et al. | |
| 6,372,002 B1 | 4/2002 | D'Evelyn et al. | |
| 6,398,867 B1 | 6/2002 | D'Evelyn et al. | |
| 6,406,776 B1 | 6/2002 | D'Evelyn | |
| 6,455,877 B1 | 9/2002 | Ogawa et al. | |
| 6,475,254 B1 | 11/2002 | Saak et al. | |
| 6,533,874 B1 | 3/2003 | Vaudo et al. | |
| 6,541,115 B2 | 4/2003 | Pender et al. | |
| 6,596,040 B2 | 7/2003 | Saak et al. | |
| 6,596,079 B1 | 7/2003 | Vaudo et al. | |
| 6,639,925 B2 | 10/2003 | Niwa et al. | |
| 6,656,615 B2 | 12/2003 | Dwilinski et al. | |
| 6,764,297 B2 | 7/2004 | Godwin et al. | |
| 6,765,240 B2 | 7/2004 | Tischler et al. | |
| 6,784,463 B2 | 8/2004 | Camras et al. | |
| 6,787,814 B2 | 9/2004 | Udagawa | |

(Continued)

FOREIGN PATENT DOCUMENTS

| | | |
|---|---|---|
| JP | 2005-289797 A2 | 10/2005 |
| JP | 2007-039321 A | 2/2007 |

(Continued)

OTHER PUBLICATIONS

Office action for U.S. Appl. No. 12/497,969 (Feb. 2, 2012).

(Continued)

*Primary Examiner* — Colleen Matthews
(74) *Attorney, Agent, or Firm* — Kilpatrick Townsend & Stockton LLP

(57) ABSTRACT

A high efficiency photonic-crystal light emitting diode comprises a flip-chipped stack of $Al_xIn_yGa_{1-x-y}N$ layers, where $0 \leq x, y, x+y \leq 1$. Each layer has a high crystalline quality, with a dislocation density below about $10^5$ cm$^{-2}$. The backside of the stack, exposed by removal of the original substrate, has a photonic crystal pattern for improved light extraction.

34 Claims, 11 Drawing Sheets

Deposited structure

Top view of photonic crystal structures

U.S. PATENT DOCUMENTS

| | | |
|---|---|---|
| 6,806,508 B2 | 10/2004 | D'Evelyn et al. |
| 6,858,882 B2 | 2/2005 | Tsuda et al. |
| 6,861,130 B2 | 3/2005 | D'Evelyn et al. |
| 6,936,488 B2 | 8/2005 | D'Evelyn et al. |
| 6,955,719 B2 | 10/2005 | Dmitriev et al. |
| 7,001,577 B2 | 2/2006 | Zimmerman et al. |
| 7,009,199 B2 | 3/2006 | Hall et al. |
| 7,009,215 B2 | 3/2006 | D'Evelyn et al. |
| 7,012,279 B2 * | 3/2006 | Wierer Jr. et al. ............... 257/94 |
| 7,026,755 B2 | 4/2006 | Setlur et al. |
| 7,033,858 B2 | 4/2006 | Chai et al. |
| 7,053,413 B2 | 5/2006 | D'Evelyn et al. |
| 7,063,741 B2 | 6/2006 | D'Evelyn et al. |
| 7,067,407 B2 | 6/2006 | Kostamo et al. |
| 7,078,731 B2 | 7/2006 | D'Evelyn et al. |
| 7,098,487 B2 | 8/2006 | D'Evelyn et al. |
| 7,101,433 B2 | 9/2006 | D'Evelyn et al. |
| 7,102,158 B2 | 9/2006 | Tysoe et al. |
| 7,105,865 B2 | 9/2006 | Nakahata et al. |
| 7,112,829 B2 | 9/2006 | Picard et al. |
| 7,119,372 B2 | 10/2006 | Stokes et al. |
| 7,122,827 B2 | 10/2006 | Alizadeh et al. |
| 7,125,453 B2 | 10/2006 | D'Evelyn et al. |
| 7,160,388 B2 | 1/2007 | Dwilinski et al. |
| 7,160,531 B1 | 1/2007 | Jacques et al. |
| 7,175,704 B2 | 2/2007 | D'Evelyn et al. |
| 7,198,671 B2 | 4/2007 | Ueda |
| 7,208,393 B2 | 4/2007 | Haskell et al. |
| 7,220,658 B2 | 5/2007 | Haskell et al. |
| 7,252,712 B2 | 8/2007 | Dwilinski et al. |
| 7,285,801 B2 | 10/2007 | Eliashevich et al. |
| 7,291,544 B2 | 11/2007 | D'Evelyn et al. |
| 7,316,746 B2 | 1/2008 | D'Evelyn et al. |
| 7,329,371 B2 | 2/2008 | Setlur et al. |
| 7,335,262 B2 | 2/2008 | Dwilinski et al. |
| 7,338,828 B2 | 3/2008 | Imer et al. |
| 7,358,542 B2 | 4/2008 | Radkov et al. |
| 7,364,619 B2 | 4/2008 | Dwilinski et al. |
| 7,368,015 B2 | 5/2008 | D'Evelyn et al. |
| 7,381,391 B2 | 6/2008 | Spencer et al. |
| 7,420,261 B2 | 9/2008 | Dwilinski et al. |
| 7,572,425 B2 | 8/2009 | McNulty et al. |
| 7,625,446 B2 | 12/2009 | D'Evelyn et al. |
| 7,642,122 B2 | 1/2010 | Tysoe et al. |
| 7,704,324 B2 | 4/2010 | D'Evelyn et al. |
| 7,705,276 B2 | 4/2010 | Giddings et al. |
| 7,759,710 B1 | 7/2010 | Chiu et al. |
| 7,871,839 B2 | 1/2011 | Lee et al. |
| 7,976,630 B2 | 7/2011 | Poblenz et al. |
| 8,021,481 B2 | 9/2011 | D'Evelyn |
| 8,048,225 B2 | 11/2011 | Poblenz et al. |
| 8,097,081 B2 | 1/2012 | D'Evelyn |
| 8,148,801 B2 | 4/2012 | D'Evelyn |
| 8,188,504 B2 | 5/2012 | Lee |
| 8,198,643 B2 | 6/2012 | Lee et al. |
| 8,207,548 B2 | 6/2012 | Nagai |
| 8,284,810 B1 | 10/2012 | Sharma et al. |
| 8,299,473 B1 | 10/2012 | D'Evelyn et al. |
| 8,303,710 B2 | 11/2012 | D'Evelyn |
| 8,306,081 B1 | 11/2012 | Schmidt et al. |
| 8,323,405 B2 | 12/2012 | D'Evelyn |
| 8,329,511 B2 | 12/2012 | D'Evelyn |
| 2001/0009134 A1 | 7/2001 | Kim et al. |
| 2001/0011935 A1 | 8/2001 | Lee et al. |
| 2001/0048114 A1 | 12/2001 | Morita et al. |
| 2002/0070416 A1 | 6/2002 | Morse et al. |
| 2002/0105986 A1 | 8/2002 | Yamasaki |
| 2002/0182768 A1 | 12/2002 | Morse et al. |
| 2002/0189532 A1 | 12/2002 | Motoki et al. |
| 2003/0027014 A1 | 2/2003 | Johnson et al. |
| 2003/0140845 A1 | 7/2003 | D'Evelyn et al. |
| 2003/0145784 A1 | 8/2003 | Thompson et al. |
| 2003/0164507 A1 | 9/2003 | Edmond et al. |
| 2003/0183155 A1 | 10/2003 | D'Evelyn et al. |
| 2003/0209191 A1 | 11/2003 | Purdy |
| 2003/0232512 A1 | 12/2003 | Dickinson et al. |
| 2004/0000266 A1 | 1/2004 | D'Evelyn et al. |
| 2004/0023427 A1 | 2/2004 | Chua et al. |
| 2004/0104391 A1 | 6/2004 | Maeda et al. |
| 2004/0124435 A1 | 7/2004 | D'Evelyn et al. |
| 2004/0161222 A1 | 8/2004 | Niida et al. |
| 2004/0222357 A1 | 11/2004 | King et al. |
| 2005/0087753 A1 | 4/2005 | D'Evelyn et al. |
| 2005/0098095 A1 | 5/2005 | D'Evelyn et al. |
| 2005/0109240 A1 | 5/2005 | Maeta et al. |
| 2005/0121679 A1 | 6/2005 | Nagahama et al. |
| 2005/0128459 A1 | 6/2005 | Zwet et al. |
| 2005/0128469 A1 | 6/2005 | Hall et al. |
| 2005/0152820 A1 | 7/2005 | D'Evelyn et al. |
| 2005/0167680 A1 | 8/2005 | Shei et al. |
| 2005/0191773 A1 | 9/2005 | Suzuki et al. |
| 2005/0205215 A1 | 9/2005 | Giddings et al. |
| 2005/0263791 A1 | 12/2005 | Yanagihara et al. |
| 2006/0030738 A1 | 2/2006 | Vanmaele et al. |
| 2006/0032428 A1 | 2/2006 | Dwilinski et al. |
| 2006/0037529 A1 | 2/2006 | D'Evelyn et al. |
| 2006/0037530 A1 | 2/2006 | Dwilinski et al. |
| 2006/0038193 A1 | 2/2006 | Wu et al. |
| 2006/0048699 A1 | 3/2006 | D'Evelyn et al. |
| 2006/0096521 A1 | 5/2006 | D'Evelyn et al. |
| 2006/0118799 A1 | 6/2006 | D'Evelyn et al. |
| 2006/0163589 A1 | 7/2006 | Fan et al. |
| 2006/0169993 A1 | 8/2006 | Fan et al. |
| 2006/0177362 A1 | 8/2006 | D'Evelyn et al. |
| 2006/0207497 A1 | 9/2006 | D'Evelyn et al. |
| 2006/0213429 A1 | 9/2006 | Motoki et al. |
| 2006/0214287 A1 | 9/2006 | Ogihara et al. |
| 2006/0228870 A1 | 10/2006 | Oshima |
| 2006/0246687 A1 | 11/2006 | Kaiser et al. |
| 2006/0255343 A1 | 11/2006 | Ogihara et al. |
| 2006/0289386 A1 | 12/2006 | Tysoe et al. |
| 2007/0015345 A1 | 1/2007 | Baker et al. |
| 2007/0057337 A1 | 3/2007 | Kano et al. |
| 2007/0077674 A1 | 4/2007 | Okuyama et al. |
| 2007/0096239 A1 | 5/2007 | Cao et al. |
| 2007/0105351 A1 | 5/2007 | Motoki et al. |
| 2007/0114569 A1 | 5/2007 | Wu et al. |
| 2007/0121690 A1 | 5/2007 | Fujii et al. |
| 2007/0131967 A1 | 6/2007 | Kawaguchi et al. |
| 2007/0141819 A1 | 6/2007 | Park |
| 2007/0142204 A1 | 6/2007 | Park et al. |
| 2007/0151509 A1 | 7/2007 | Park |
| 2007/0158785 A1 | 7/2007 | D'Evelyn et al. |
| 2007/0164292 A1 | 7/2007 | Okuyama |
| 2007/0166853 A1 | 7/2007 | Guenther et al. |
| 2007/0178039 A1 | 8/2007 | D'Evelyn et al. |
| 2007/0181056 A1 | 8/2007 | D'Evelyn et al. |
| 2007/0190758 A1 | 8/2007 | Kaeding et al. |
| 2007/0197004 A1 | 8/2007 | Dadgar et al. |
| 2007/0210074 A1 | 9/2007 | Maurer et al. |
| 2007/0215033 A1 | 9/2007 | Imaeda et al. |
| 2007/0228404 A1 | 10/2007 | Tran et al. |
| 2007/0234946 A1 | 10/2007 | Hashimoto et al. |
| 2007/0252164 A1 | 11/2007 | Zhong et al. |
| 2007/0274359 A1 | 11/2007 | Takeuchi et al. |
| 2007/0290224 A1 | 12/2007 | Ogawa |
| 2008/0006831 A1 | 1/2008 | Ng |
| 2008/0008855 A1 | 1/2008 | D'Evelyn et al. |
| 2008/0023691 A1 | 1/2008 | Jang et al. |
| 2008/0025360 A1 | 1/2008 | Eichler et al. |
| 2008/0073660 A1 | 3/2008 | Ohno et al. |
| 2008/0083741 A1 | 4/2008 | Giddings et al. |
| 2008/0083929 A1 | 4/2008 | Fan et al. |
| 2008/0087919 A1 | 4/2008 | Tysoe et al. |
| 2008/0106212 A1 | 5/2008 | Yen et al. |
| 2008/0121906 A1 | 5/2008 | Yakushiji |
| 2008/0128752 A1 | 6/2008 | Wu |
| 2008/0156254 A1 | 7/2008 | Dwilinski et al. |
| 2008/0193363 A1 | 8/2008 | Tsuji |
| 2008/0198881 A1 | 8/2008 | Farrell et al. |
| 2008/0211416 A1 | 9/2008 | Negley et al. |
| 2008/0230765 A1 | 9/2008 | Yoon et al. |
| 2008/0272462 A1 | 11/2008 | Shimamoto |
| 2008/0282978 A1 | 11/2008 | Butcher et al. |
| 2008/0285609 A1 | 11/2008 | Ohta et al. |
| 2008/0298409 A1 | 12/2008 | Yamashita et al. |
| 2009/0078955 A1 | 3/2009 | Fan et al. |

| | | | |
|---|---|---|---|
| 2009/0092536 A1 | 4/2009 | Kawabata et al. | |
| 2009/0146170 A1 | 6/2009 | Zhong et al. | |
| 2009/0213593 A1 | 8/2009 | Foley et al. | |
| 2009/0218593 A1 | 9/2009 | Kamikawa et al. | |
| 2009/0250686 A1 | 10/2009 | Sato et al. | |
| 2009/0301387 A1 | 12/2009 | D'Evelyn | |
| 2009/0301388 A1 | 12/2009 | D'Evelyn | |
| 2009/0309110 A1 | 12/2009 | Raring et al. | |
| 2009/0320744 A1 | 12/2009 | D'Evelyn et al. | |
| 2009/0320745 A1 | 12/2009 | D'Evelyn et al. | |
| 2010/0001300 A1 | 1/2010 | Raring et al. | |
| 2010/0003492 A1 | 1/2010 | D'Evelyn | |
| 2010/0025656 A1 | 2/2010 | Raring et al. | |
| 2010/0031872 A1 | 2/2010 | D'Evelyn | |
| 2010/0031873 A1 | 2/2010 | D'Evelyn | |
| 2010/0031874 A1 | 2/2010 | D'Evelyn | |
| 2010/0031875 A1 | 2/2010 | D'Evelyn | |
| 2010/0031876 A1 | 2/2010 | D'Evelyn | |
| 2010/0032691 A1 | 2/2010 | Kim | |
| 2010/0108985 A1 | 5/2010 | Chung et al. | |
| 2010/0109030 A1 | 5/2010 | Krames et al. | |
| 2010/0117101 A1 | 5/2010 | Kim et al. | |
| 2010/0117118 A1 | 5/2010 | Dabiran et al. | |
| 2010/0147210 A1 | 6/2010 | D'Evelyn | |
| 2010/0151194 A1 | 6/2010 | D'Evelyn | |
| 2010/0219505 A1 | 9/2010 | D'Evelyn | |
| 2010/0295088 A1 | 11/2010 | D'Evelyn et al. | |
| 2011/0017298 A1 | 1/2011 | Lee | |
| 2011/0100291 A1 | 5/2011 | D'Evelyn | |
| 2011/0108081 A1 | 5/2011 | Werthen et al. | |
| 2011/0121331 A1 | 5/2011 | Simonian et al. | |
| 2011/0175200 A1 | 7/2011 | Yoshida | |
| 2011/0183498 A1 | 7/2011 | D'Evelyn | |
| 2011/0220912 A1 | 9/2011 | D'Evelyn | |
| 2011/0256693 A1 | 10/2011 | D'Evelyn et al. | |
| 2011/0262773 A1 | 10/2011 | Poblenz et al. | |
| 2012/0000415 A1 | 1/2012 | D'Evelyn et al. | |
| 2012/0007102 A1 | 1/2012 | Feezell et al. | |
| 2012/0073494 A1 | 3/2012 | D'Evelyn | |
| 2012/0091465 A1 | 4/2012 | Krames et al. | |
| 2012/0118223 A1 | 5/2012 | D'Evelyn | |
| 2012/0137966 A1 | 6/2012 | D'Evelyn et al. | |
| 2012/0178215 A1 | 7/2012 | D'Evelyn | |
| 2012/0187412 A1 | 7/2012 | D'Evelyn et al. | |
| 2012/0199952 A1 | 8/2012 | D'Evelyn et al. | |

FOREIGN PATENT DOCUMENTS

| | | | |
|---|---|---|---|
| WO | WO 2005121415 A1 | 12/2005 | |
| WO | WO2007-004495 | 1/2007 | |
| WO | WO2012-016033 | 2/2012 | |

OTHER PUBLICATIONS

Office action for U.S. Appl. No. 12/478,736 (Feb. 7, 2012).
Office action for U.S. Appl. No. 12/569,841 (Dec. 23, 2011).
Office action for U.S. Appl. No. 12/724,983 (Mar. 5, 2012).
Office action for U.S. Appl. No. 12/785,404 (Mar. 6, 2012).
Office action for U.S. Appl. No. 12/491,176 (Mar. 1, 2012).
Fukuda et al. "Prospects for the ammonothermal growth of large GaN crystal," Journal of Crystal Growth 305: 304-310 (Jul. 2007).
International Search Report of PCT Application No. PCT/US2009/48489, dated Sep. 14, 2009, 3 pages total.
Lide et al., 'Thermal Conductivity of Ceramics and Other Insulating Materials,' CRC Handbook of Chemistry and Physics, 91st Edition, 2010-2011, pp. 12-203 and 12-204.
http://www.matbase.com/material/non-ferrous-metals/other/molybdenum/properties, Data Table for: Non-Ferrous Metals: Other Metals: Molybdenum.
Pattison et al., 'Gallium Nitride Based Microcavity Light Emitting Diodes With 2λ Effective Cavity Thickness', Applied Physics Letters, vol. 90, Issue 3, 031111 (2007) 3pg.
USPTO Office Action for U.S. Appl. No. 12/133,364 dated Nov. 26, 2010.
USPTO Office Action for U.S. Appl. No. 12/133,364 dated Jun. 1, 2011.
USPTO Notice of Allowance for U.S. Appl. No. 12/133,364 dated Oct. 11, 2011.
USPTO Office Action for U.S. Appl. No. 12/133,365 dated Jun. 9, 2011.
USPTO Office Action for U.S. Appl. No. 12/133,365 dated Oct. 18, 2011.
USPTO Office Action for U.S. Appl. No. 12/334,418 dated Apr. 5, 2011.
USPTO Office Action for U.S. Appl. No. 12/334,418 dated Oct. 19, 2011.
USPTO Office Action for U.S. Appl. No. 12/478,736 dated Sep. 27, 2011.
USPTO Notice of Allowance for U.S. Appl. No. 12/478,736 dated Apr. 23, 2012.
USPTO Office Action for U.S. Appl. No. 12/484,095 dated Nov. 10, 2010.
USPTO Office Action for U.S. Appl. No. 12/484,095 dated Jul. 8, 2011.
USPTO Office Action for U.S. Appl. No. 12/534,838 dated May 3, 2011.
USPTO Office Action for U.S. Appl. No. 12/534,838 dated Jan. 13, 2012.
USPTO Office Action for U.S. Appl. No. 12/534,838 dated Mar. 20, 2012.
USPTO Notice of Allowance for U.S. Appl. No. 12/534,838 dated Jun. 8, 2012.
USPTO Office Action for U.S. Appl. No. 12/534,844 dated Sep. 16, 2010.
USPTO Office Action for U.S. Appl. No. 12/534,844 dated Feb. 2, 2011.
USPTO Office Action for U.S. Appl. No. 12/534,857 dated Sep. 1, 2010.
USPTO Notice of Allowance for U.S. Appl. No. 12/534,857 dated May 27, 2011.
USPTO Office Action for U.S. Appl. No. 12/546,458 dated Jul. 20, 2011.
USPTO Notice of Allowance for U.S. Appl. No. 12/546,458 dated Nov. 28, 2011.
USPTO Office Action for U.S. Appl. No. 12/556,558 dated Sep. 16, 2010.
USPTO Notice of Allowance for U.S. Appl. No. 12/556,558 dated Mar. 22, 2011.
USPTO Office Action for U.S. Appl. No. 12/556,562 dated Sep. 15, 2010.
USPTO Office Action for U.S. Appl. No. 12/556,562 dated Mar. 21, 2011.
USPTO Notice of Allowance for U.S. Appl. No. 12/556,562 dated Jul. 27, 2011.
USPTO Office Action for U.S. Appl. No. 12/569,337 dated May 9, 2012.
USPTO Office Action for U.S. Appl. No. 12/634,665 dated Apr. 25, 2012.
USPTO Notice of Allowance for U.S. Appl. No. 12/754,886 dated May 17, 2012.
USPTO Notice of Allowance for U.S. Appl. No. 12/754,886 dated Jun. 5, 2012.
USPTO Notice of Allowance for U.S. Appl. No. 12/754,886 dated Jun. 20, 2012.
Byrappa et al., "Handbook of Hydrothermal Technology: A Technology for Crystal Growth and Materials Processing," Noyes Publications, Park Ridge, New Jersey, 2001, pp. 94-96 and 152.
Callahan et al., "Synthesis and Growth of Gallium Nitride by the Chemical Vapor Reaction Process (CVRP)," 1999, MRS Internet Journal Nitride Semiconductor Research, vol. 4, Issue No. 10, pp. 1-6.
D'Evelyn et al., "Bulk GaN Crystal Growth by the High-Pressure Ammonothermal Method," Journal of Crystal Growth, 2007, vol. 300, pp. 11-16.
Dwilinski et al, Ammono Method of BN, AlN, and GaN Synthesis and Crystal Growth,: Journal of Nitride Semiconductor Research, 1998, 3,25, MRS, Internet: http://nsr.mij.mrs.org.
Dwilinski et al., "Excellent Crystallinity of Truly Bulk Ammonothermal GaN," Journal of Crystal Growth, 2008, vol. 310, pp. 3911-3916.
Ehrentraut et al., "Prospects for the Ammonothermal Growth of Large GaN Crystal," Journal of Crystal Growth, 2007, vol. 305, pp. 304-310.

Farrell et al., "Continuous-wave Operation of AlGaN-cladding-free Nonpolar m-Plane InGaN/GaN Laser Diodes," 2007, Japanese Journal of Applied Physics, vol. 46, No. 32, pp. L761-L763.

Feezell et al., "AlGaN-Cladding-Free Nonpolar InGaN/GaN Laser Diodes," Japanese Journal of Applied Physics, vol. 46, No. 13, pp. L284-L286.

Frayssinet et al., "Evidence of Free Carrier Concentration Gradient Along the c-axis for Undoped GaN Single Crystals," Journal of Crystal Growth, 2001, vol. 230, pp. 442-447.

Hashimoto et al. "Ammonothermal growth of bulk GaN," Journal of Crystal Growth 310:3907-3910 (Aug. 2008).

Hashimoto et al. "A GaN bulk crystal wit improved structural quality grown by the ammonothermal method," Nature Materials 6:568-671 (Jul. 2007).

Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.

Kim et al, "Improved Electroluminescence on Nonpolar m-plane InGaN/GaN Qantum Well LEDs", 2007, Physics Status Solidi (RRL), vol. 1, No. 3, pp. 125-127.

Kojima et al., "Stimulated Emission at 474 nm from an InGaN Laser Diode Structure Grown on a (1122) GaN Substrate ," 2007, Applied Physics Letter, vol. 91, No. 25, pp. 251107-251107-3.

Kolis et al., "Crystal Growth of Gallium Nitride in Supercritical Ammonia," Journal of Crystal Growth, 2001, vol. 222, pp. 431-434.

Kolis et al., "Materials Chemistry and Bulk Crystal Growth of Group III Nitrides in Supercritical Ammonia" Mat. Res. Soc. Symp. Proc.; 1998, vol. 495, pp. 367-372.

Kubota et al., "Temperature Dependence of Polarized Photoluminescence from Nonpolar m-plane InGaN Multiple Quantum Wells for Blue Laser Diodes" 2008, Applied Physics Letter, vol. 92, pp. 011920-011920-3.

Mirwald et al., "Low-Friction Cell for Piston-Cylinder High Pressure Apparatus," Journal of Geophysical Research, 1975, vol. 80, No. 11, pp. 1519-1525.

Motoki et al. "Growth and Characterization of Freestanding GaN Substrates," Journal of Crystal Growth, 2002, vol. 237-239, pp. 912-921.

Murota et al., "Solid State Light Source Fabricated with YAG:Ce Single Crystal," 2002, Japanese Journal of Applied Physics, vol. 46, No. 41, Part 2, No. 8A, pp. L887-L888.

Okamoto et al., "Continuous-Wave Operation of m-Plane InGaN Multiple Quantum Well Laser Diodes," 2007, Japanese Journal of Applied Physics, vol. 46, No. 9, pp. L187-L189.

Okamoto et al., "Pure Blue Laser Diodes Based on Nonpolar m-Plane Gallium Nitride with InGaN Waveguiding Layers," 2007, Japanese Journal of Applied Physics, vol. 46, No. 35, pp. L820-L822.

Oshima et al., "Thermal and Optical Properties of Bulk GaN Crystals Fabricated Through Hydride Vapor Phase Epitaxy with Void-Assisted Separation," 2005, Journal of Applied Physics, vol. 98, pp. 103509-1-103509-3.

Peters, "Ammonothermal Synthesis of Aluminium Nitride," Journal of Crystal Growth, 1999, vol. 4, pp. 411-418.

Sarva, et al. "Dynamic compressive strength of silicon carbide under uniaxial compression," Mat. Sci. & Eng. A 317,140 (2001).

Sato et al., "High Power and High Efficiency Green Light Emitting Diode on free-Standing Semipolar (1122) Bulk GaN Substrate," 2007 Physica Status Solidi (RRL), vol. 1, pp. 162-164.

Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.

Schmidt et al., "Demonstration of Nonpolar m-Plane InGaN/GaN Laser Diodes ," 2007, Japanese Journal of Applied Physics, vol. 46, No. 9, L190-L191.

Sizov et al., "500-nm Optical Gain Anisotropy of Semipolar (1122) InGaN Quantum Wells," 2009, Applied Physics Express, vol. 2, pp. 071001-1-071001-3.

Tsuda et al., "Blue Laser Diodes Fabricated on m-Plane GaN Substrates," 2008, Applied Physics Express, vol. 1, pp. 011104-011104-03.

Tyagi et al., "Semipolar (1011) InGaN/GaN Laser Diodes on Bulk GaN Substrates," 2007, Japanese Journal of Applied Physics, vol. 46, No. 19, pp. L444-L445.

Wang et al. "Ammonothermal growth of GaN crystals in alkaline solutions," Journal of crystal Growth 287:376-380 (Jan. 2006).

Wang et al., "Ammonothermal Synthesis of III-Nitride Crystals," Crystal Growth & Design, 2006, vol. 6, Issue No. 6, pp. 1227-1246.

Wang et al., "Synthesis of Dense Polycrystaline GaN of High Purity by the Chemical Vapor Reaction Process," Journal of Crystal Growth, 2006, vol. 286, pp. 50-54.

Zhong et al., "Demonstration of High Power Blue-Green Light Emitting Diode on Semipolar Bulk GaN Substrate," 2007, Electron Letter, vol. 43, No. 15, pp. 825-826.

Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.

USPTO Office Action for U.S. Appl. No. 12/497,969 dated Jul. 5, 2012.

USPTO Office Action for U.S. Appl. No. 12/534,843 dated Sep. 10, 2012.

USPTO Notice of Allowance for U.S. Appl. No. 12/534,849 dated Jul. 31, 2012.

USPTO Notice of Allowance for U.S. Appl. No. 12/785,404 dated Jul. 16, 2012.

USPTO Office Action for U.S. Appl. No. 13/179,346 dated Aug. 17, 2012.

USPTO Notice of Allowance for U.S. Appl. No. 13/425,304 dated Aug. 22, 2012.

Chiang et al. "Luminescent Properties of Cerium-Activated Garnet Series Phosphor: Structure and Temperature Effects," Journal of the Electrochemical Society 155:B517-B520 (2008).

Chiu et al. "Synthesis and Luminescence Properties of Intensely Red-Emitting $M5Eu(WO_4)_{4-x}(MoO_4)_x$ (M = Li, Na, K) Phosphors," Journal of the Electrochemical Society 15:J71-J78 (2008).

Ci et al. "$Ca_{1-x}Mo_{1-y}Nb_yO_4:Eu_x^{3+}$: A novel red phosphor for white light emitting diodes," Journal of Physics 152:670-674 (2008).

Happek "Development of Efficient UV-LED Phosphor Coatings for Energy Saving Solid State Lighting" University of Georgia (Jan. 2007).

Höppe et al. "Luminescence in $Eu^{2+}$-doped $Ba_2Si_5N_8$: fluorescence, thernoliminescence, and upconversion"; Journal of Physics and Chemistry of Solids 61:2001-2006 (2000).

Li et al. "The effect of replacement of Sr by Ca on the structural and luminescence properties of the red-emitting $Sr_2Si_5N_8:Eu_{2+}$ LED conversion phosphor," Journal of Solid State Chemistry 181:515-524 (2008).

Mueller-Mach et al. "Highly efficient all-nitride phosphor-converted white light emitting diode," Physica Status Solidi (a) 202:1727-1732 (Jul. 2005).

Setlur et al. "Crystal chemistry and luminescence of $Ce^{3+}$-doped $(Lu_2CaMg_2)$-Ca-2(Si, Ge)$_3O_{12}$ and its use in LED based lighting," Chemistry of Materials 18: 3314-3322 (2006).

Wang et al. "New red $Y_{0.85}Bi_{0.1}Eu_{0.05}V_{1-y}M_yO_4$ (M=Nb, P) phosphors for light-emitting diodes," Physica B: Condensed Matter 403:2071-2075 (Jun. 2008).

Yamamoto "White LED phosphors: the next step," Proceeding of . SPIE (2010).

Yang et al. "Preparation and luminescence properties of LED conversion novel phosphors $SrZnO_2$:Sm," Materials Letters 62:907-910 (Mar. 2008).

Choi et al., '2.51 microcavity InGaN light-emitting diodes fabricated by a selective dry-etch thinning process', Applied Physics Letters, 2007, 91(6), 061120.

Weisbuch et al., 'Recent results and latest views on microcavity LEDs', Light-Emitting Diodes: Research, Manufacturing, and Applications VIII, ed. By S.A. Stockman et al., Proc. SPIE, vol. 5366, p. 1-19 (2004).

USPTO Notice of Allowance for U.S. Appl. No. 12/478,736 dated Oct. 9, 2012.

USPTO Notice of Allowance for U.S. Appl. No. 12/569,337 dated Nov. 15, 2012.

USPTO Office Action for U.S. Appl. No. 12/634,665 dated Oct. 1, 2012.

USPTO Office Action for U.S. Appl. No. 12/891,668 dated Sep. 25, 2012.

USPTO Office Action for U.S. Appl. No. 13/025,833 dated Jul. 12, 2012.

USPTO Office Action for U.S. Appl. No. 13/041,199 dated Nov. 30, 2012.

USPTO Office Action for U.S. Appl. No. 13/175,739 dated Dec. 7, 2012.

USPTO Office Action for U.S. Appl. No. 13/179,346 dated Dec. 13, 2012.

USPTO Office Action for U.S. Appl. No. 13/226,249 dated Oct. 10, 2012.

* cited by examiner

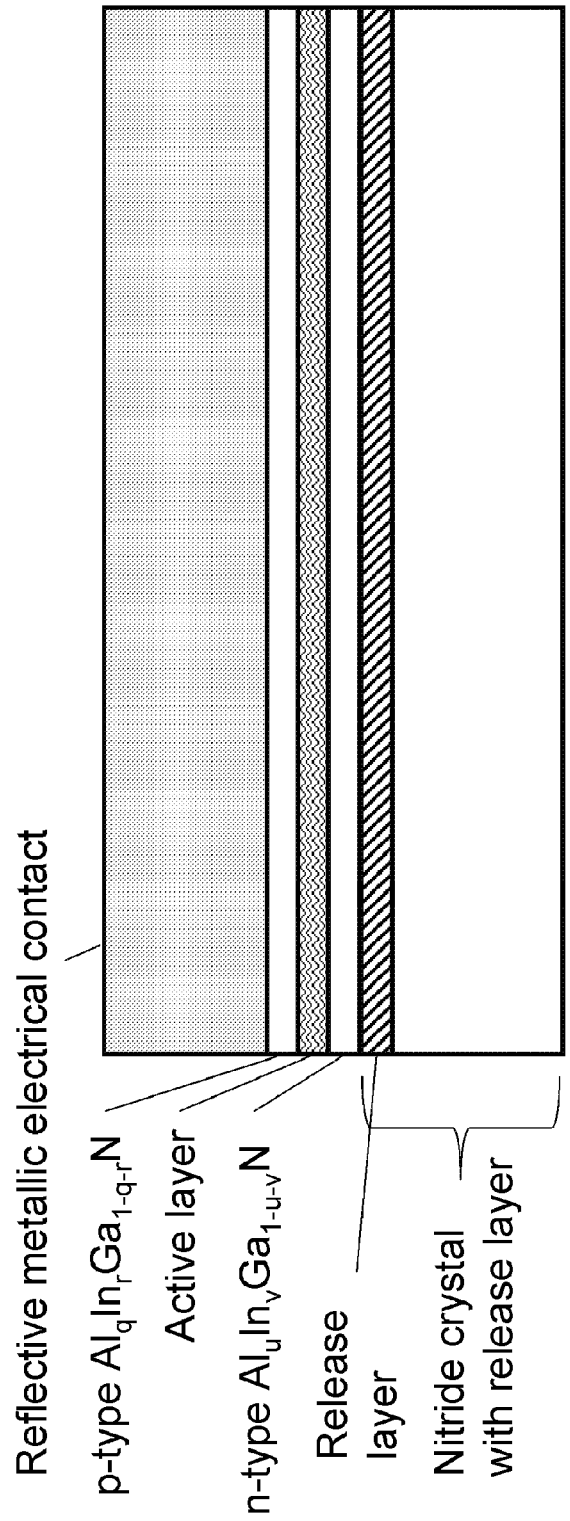
Fig. 1: Deposited structure

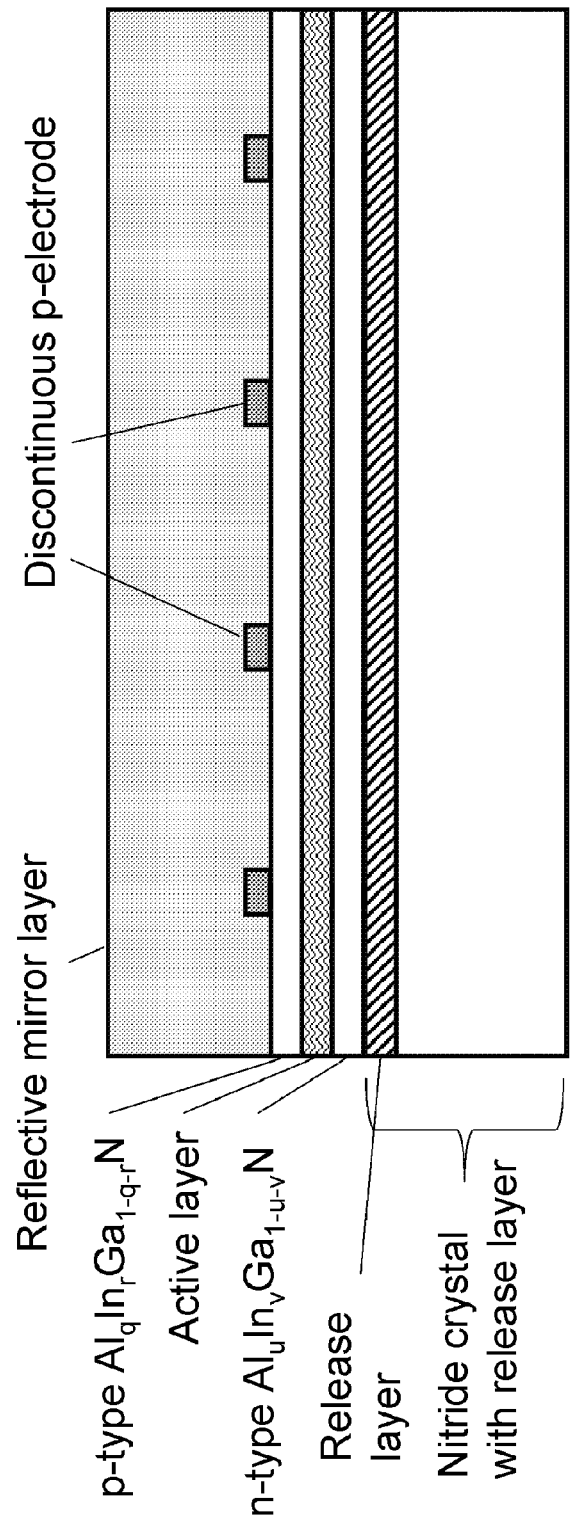
Fig. 2: Alternative structure 1

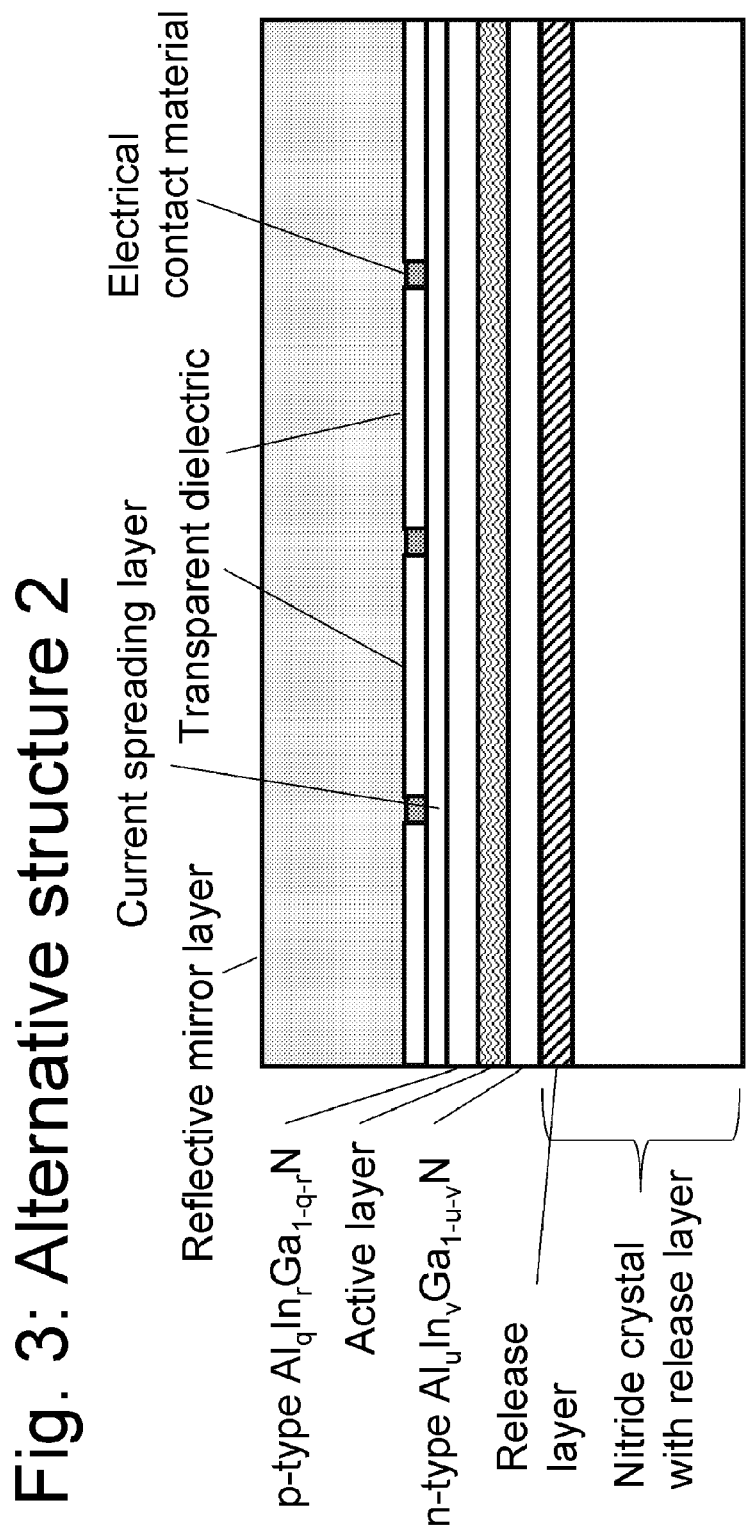

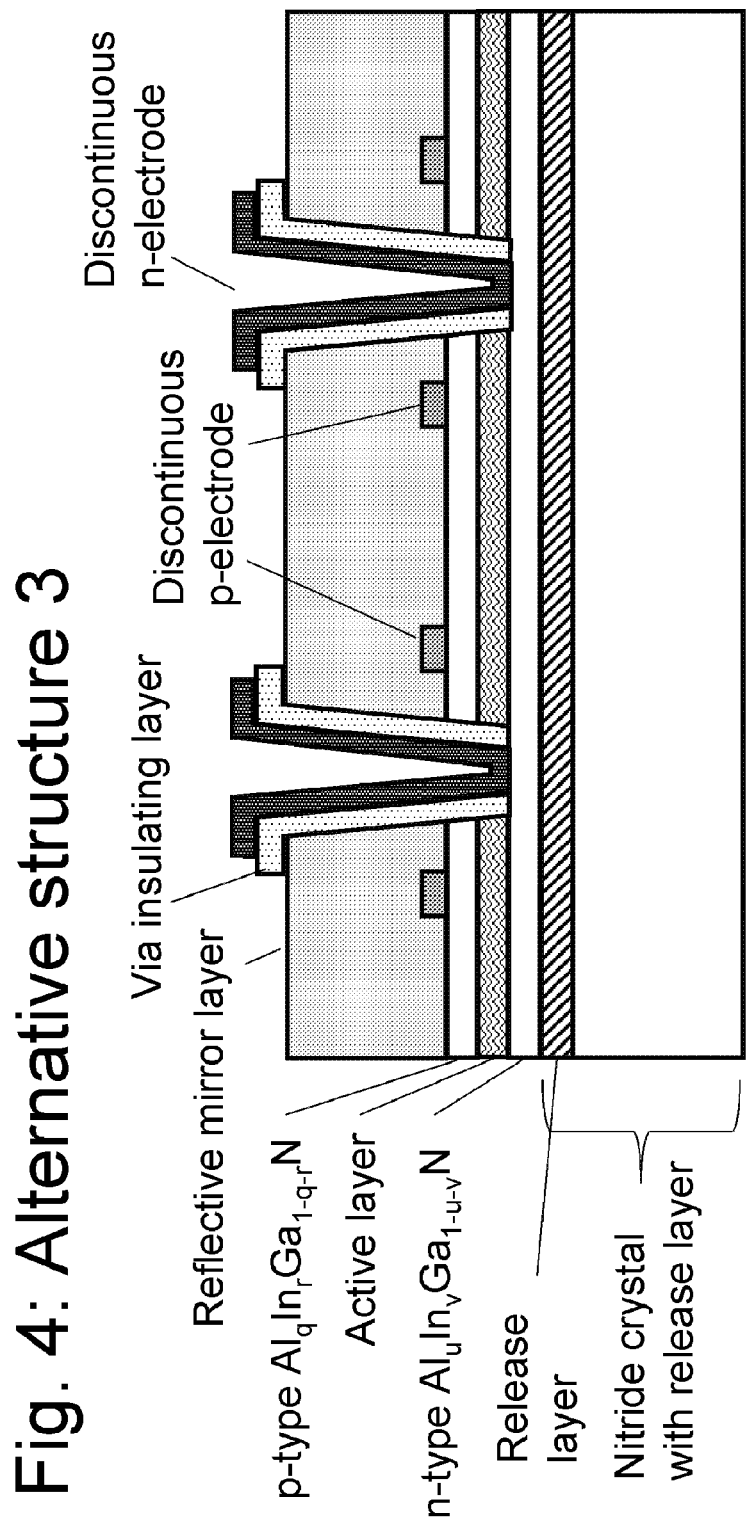

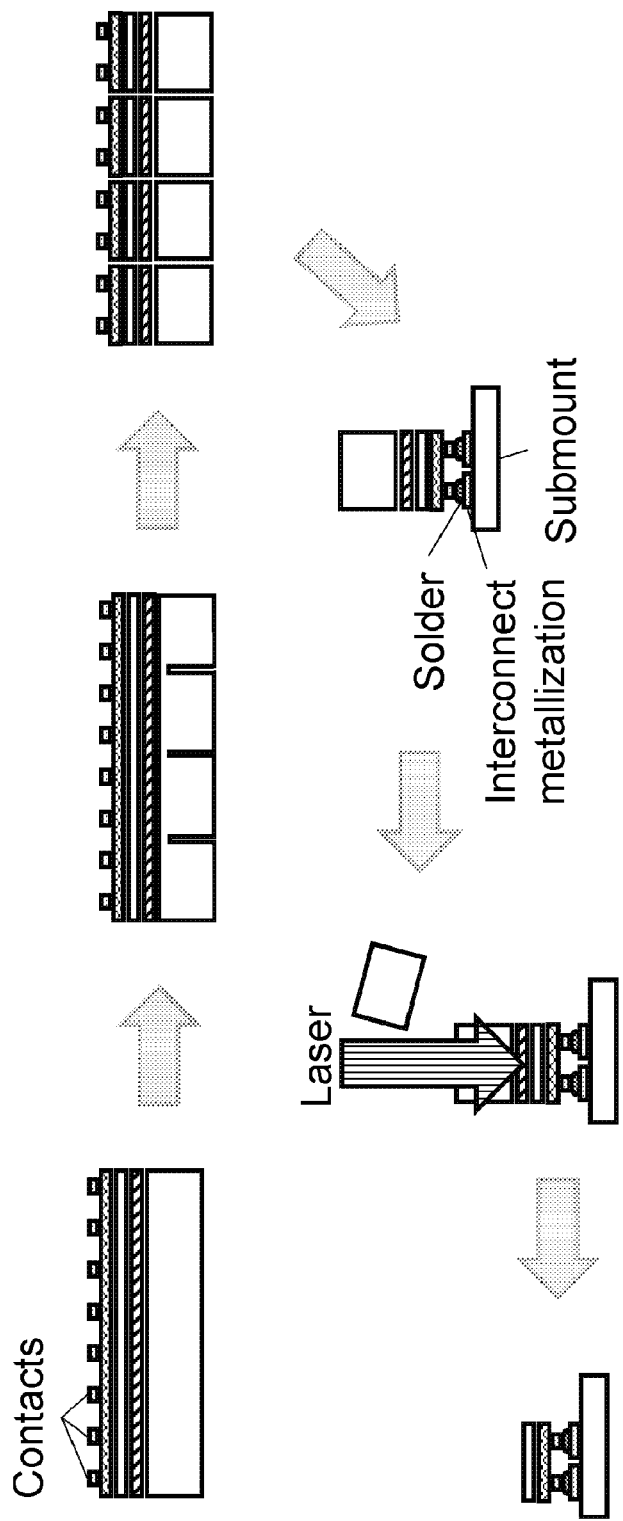
Fig. 5: Dicing and laser liftoff

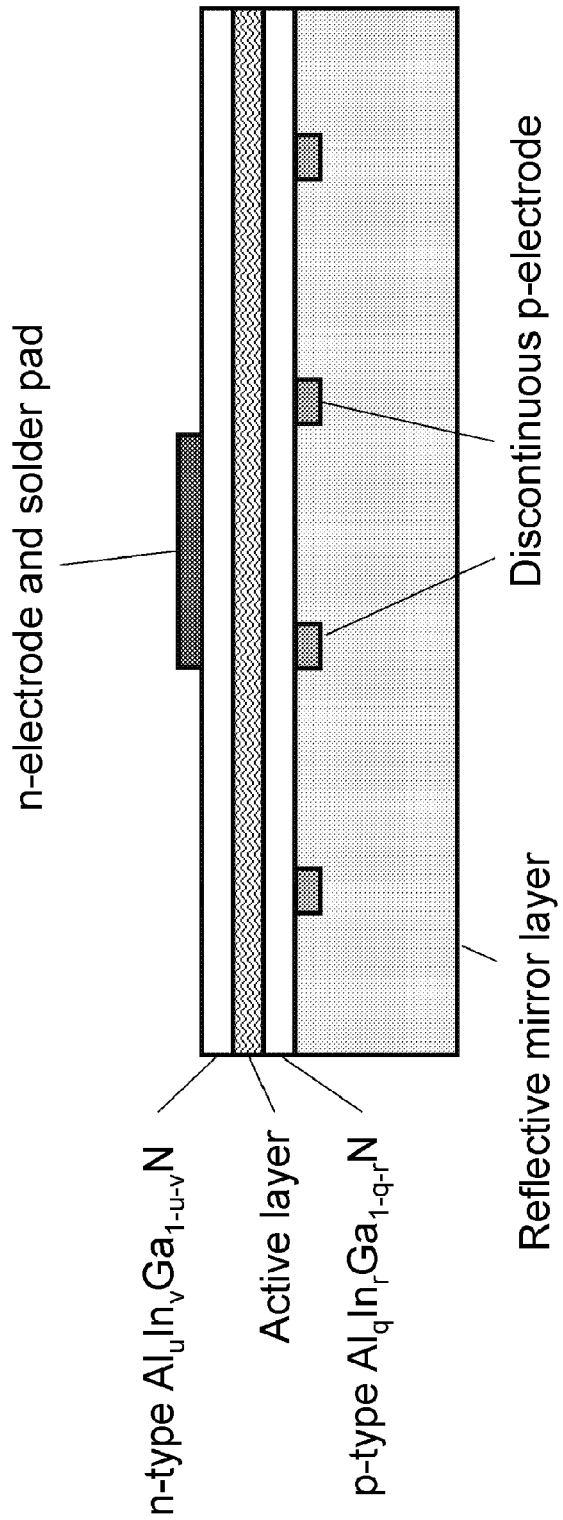
Fig. 6: Backside n-contact

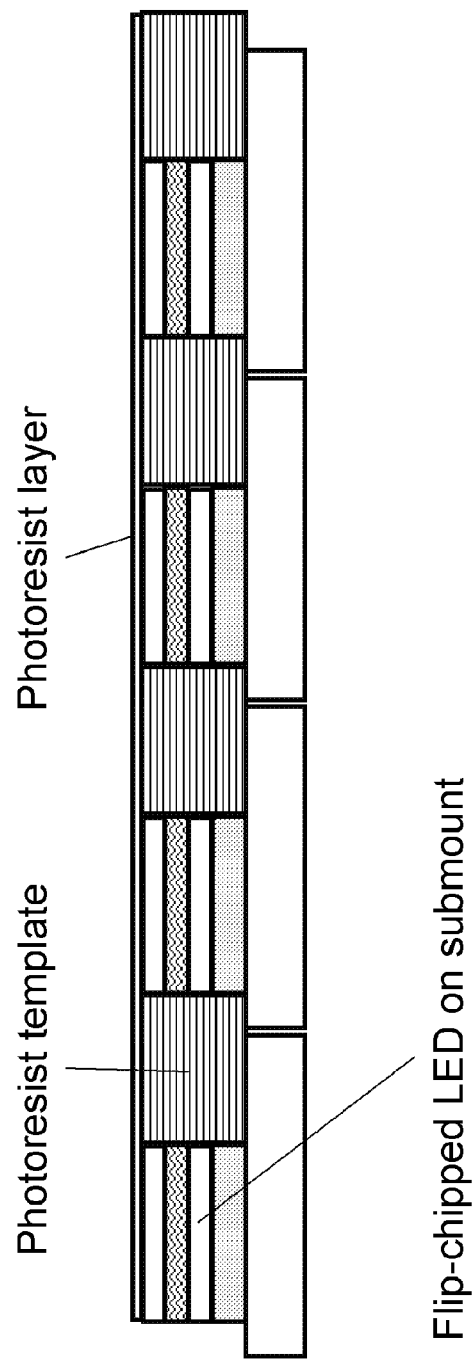
Fig. 7: Deposition of photoresist layer

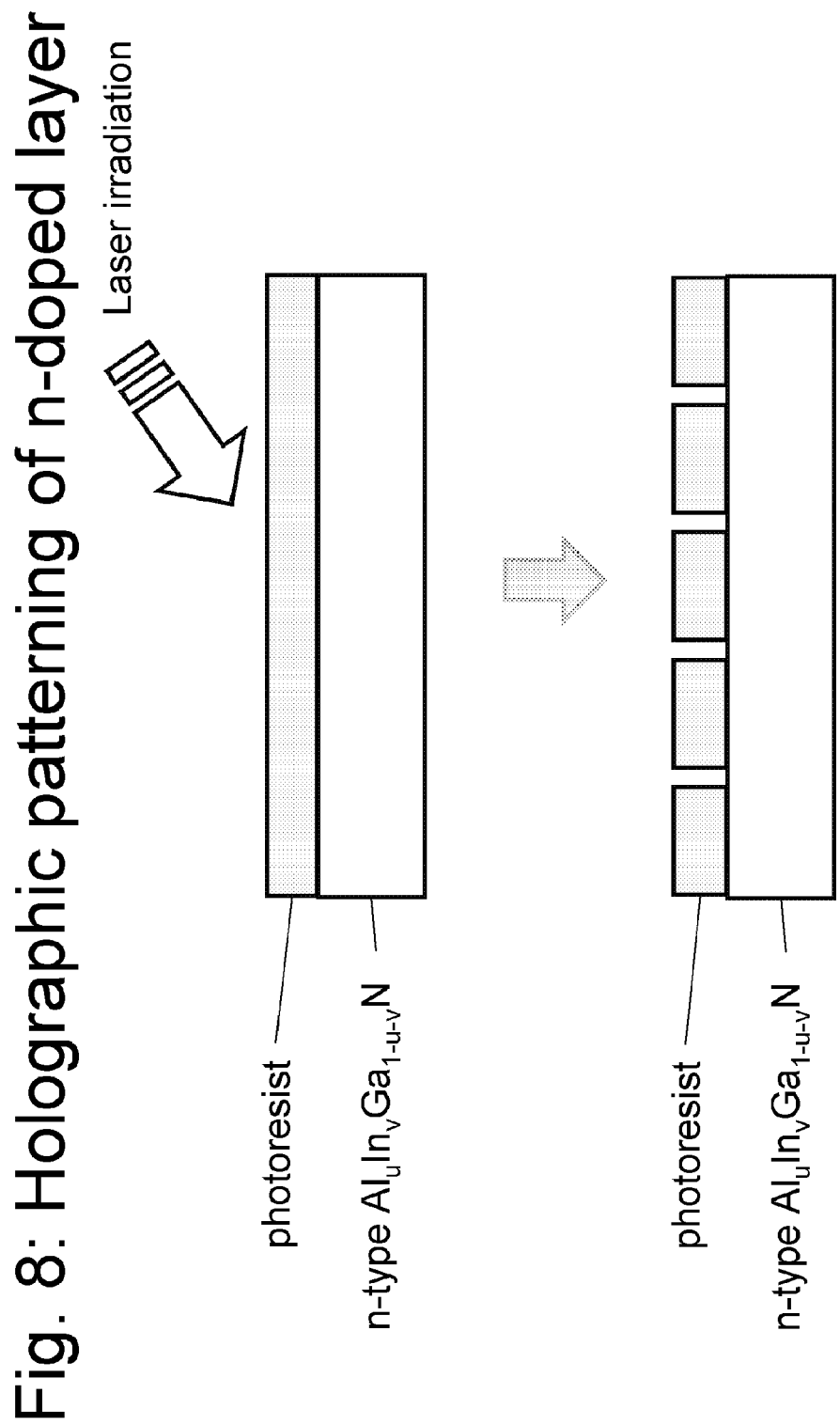
Fig. 8: Holographic patterning of n-doped layer

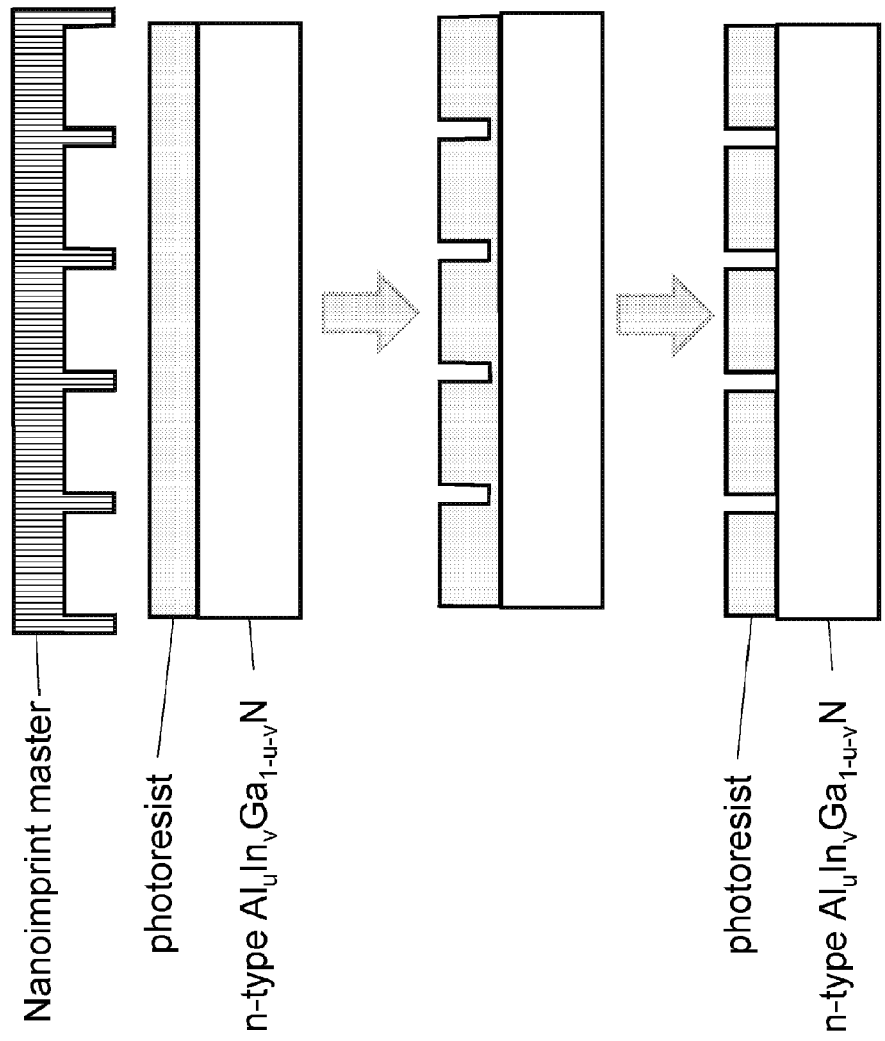

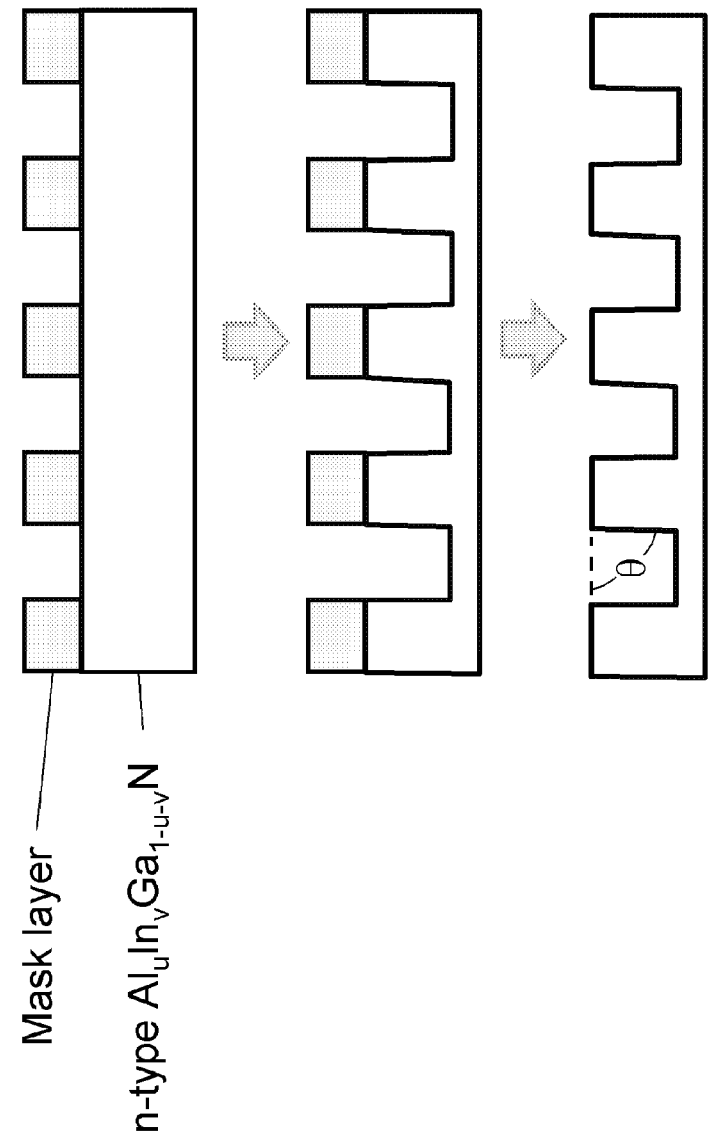

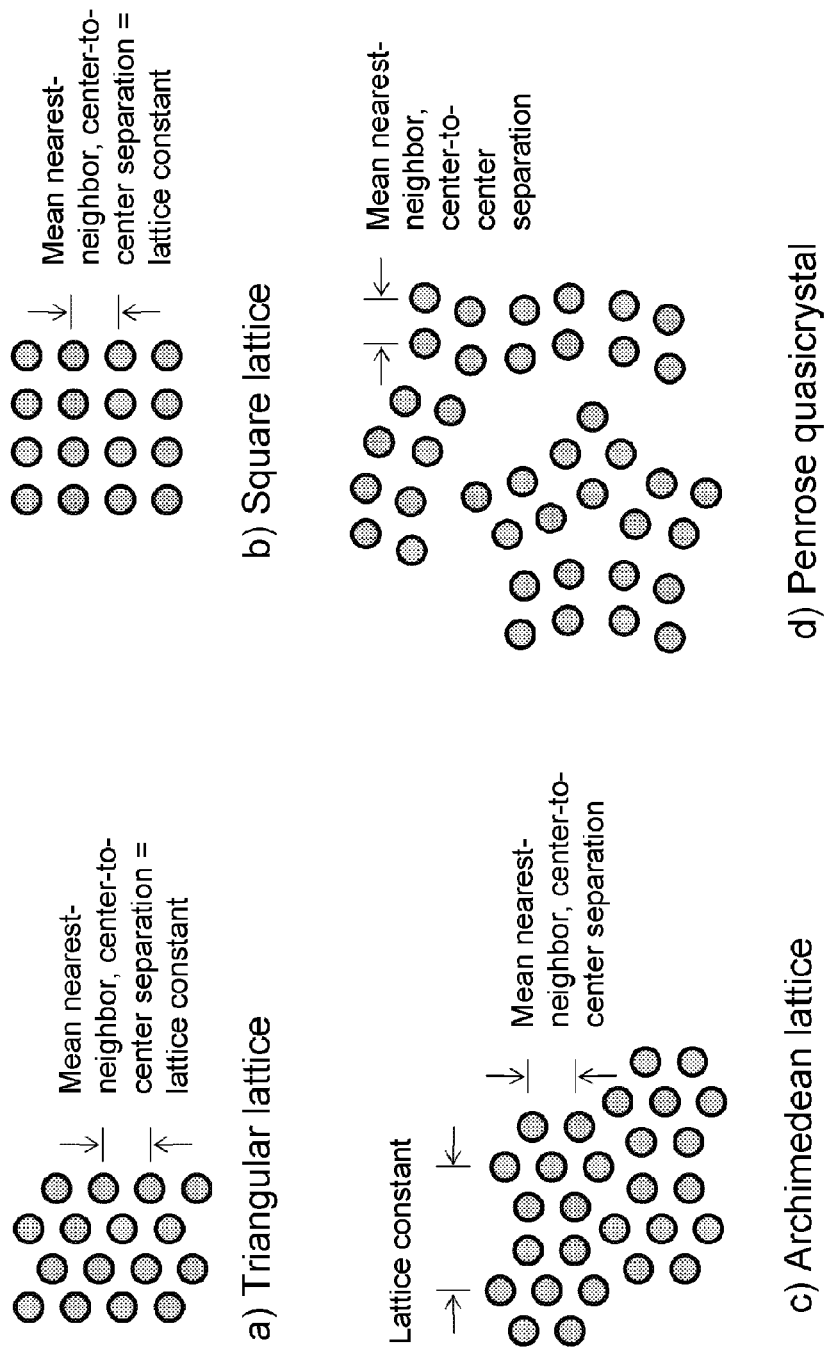

PHOTONIC-CRYSTAL LIGHT EMITTING DIODE AND METHOD OF MANUFACTURE

CROSS-REFERENCES TO RELATED APPLICATIONS

This application claims priority to U.S. Provisional Application No. 61/106,159 filed Oct. 17, 2008, commonly assigned, and of which is incorporated by reference in its entirety herein.

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention generally relates to manufacture of devices. More particularly, the present invention provides a method and device using photonic crystals or the like in combination with optical devices composed of a gallium-containing nitride crystal, but there can be others. More specifically, embodiments of the invention include techniques for fabricating a light emitting diode device using bulk gallium nitride containing materials and the like. Merely by way of example, the invention can be applied to applications such as optoelectronic devices, and the like. In other embodiments, the present invention provides a method of manufacture using a high quality epitaxial gallium containing crystal with a release layer, but it would be recognized that other crystals and materials can also be processed. Such crystals and materials include, but are not limited to, GaN, AN, InN, InGaN, AlGaN, and AlInGaN, and others for manufacture of bulk or patterned substrates.

Progress has been made during the past decade and a half in the performance of gallium nitride (GaN) based light emitting diodes (LEDs). Devices with a luminous efficiency higher than 100 lumens per watt have been demonstrated in the laboratory, and commercial devices have an efficiency that is already considerably superior to that of incandescent lamps and competitive with that of fluorescent lamps. Further improvements in efficiency are desired in order to reduce operating costs, reduce electricity consumption, and decrease emissions of carbon dioxide and other greenhouse gases produced in generating the energy used for lighting applications.

The efficiency of LEDs is limited in part by the internal quantum efficiency and by the light extraction efficiency. The internal quantum efficiency can be improved by the use of bulk gallium nitride substrates, with low concentrations of threading dislocations, and by the use of nonpolar and semipolar crystallographic orientations, which reduce or eliminate the presence of deleterious polarization electric fields within the device.

The light extraction efficiency can be improved by the formation of a photonic crystal structure on the surface. For example, Wierer et al. [Appl. Phys. Lett. 84, 3885 (2004)] demonstrated an InGaN/GaN LED with a triangular lattice photonic crystal dry-etched into the top layer. The photonic crystal pattern modified the far-field emission pattern and increased the light extraction efficiency. However, this structure involved top-surface emission, with the substrate still present. As noted by David et al. [Appl. Phys. Lett. 88, 061124 (2006)], in the absence of special efforts to confine the light to the near-surface region, light extraction remains relatively inefficient due to the poor overlap of low-order light propagation modes with the photonic crystal. In addition, the relatively poor electrical conductivity of the p-type layer makes it difficult to avoid ohmic losses in high power LEDs. One way to overcome these problems is by thinning or removal of the substrate. For example, David et al. [Appl. Phys. Lett. 88, 133514 (2006)] fabricated an LED with a photonic crystal structure on the backside of the n-type layer, exposed by flip-chip bonding of the device to a submount and performing laser liftoff of the sapphire substrate. However, this latter approach suffers from several limitations. Most importantly, the use of a sapphire or other non-GaN substrate, while providing a natural means for removal of the substrate, does not provide a means for achievement of very low dislocation densities in the active layer, which may negatively impact the internal quantum efficiency. In addition, the electron-beam lithography technique employed by David et al. does not lend itself to cost-effective manufacturing, and the reflectivity of the p-type electrical contact was undesirably low.

U.S. Pat. No. 7,053,413, hereby incorporated by reference in its entirety, teaches fabrication of a homoepitaxial LED on a bulk GaN substrate with a dislocation density below $10^4$ $cm^{-2}$, followed by removal of a portion of the substrate. However, the only means taught for removal of the portion of the substrate are lapping, polishing, chemical etching, plasma etching, and ion beam etching. These methods do not provide a natural endpoint, and it is therefore extremely difficult to remove all but a few- or sub-micron-thick layer of uniform thickness, and are slow and expensive to perform.

What is needed is a manufacturable means for fabricating a thin, photonic-crystal LED with improved light extraction capability and, simultaneously, an ultralow defect density and high crystallographic quality device structure with a high internal quantum efficiency.

BRIEF SUMMARY OF THE INVENTION

According to the present invention, techniques generally related to manufacture of devices are provided. More particularly, the present invention provides a method and device using photonic crystals or the like in combination with optical devices composed of a gallium-containing nitride crystal, but there can be others. More specifically, embodiments of the invention include techniques for fabricating a light emitting diode device using bulk gallium nitride containing materials and the like. Merely by way of example, the invention can be applied to applications such as optoelectronic devices, and the like. In other embodiments, the present invention provides a method of manufacture using a high quality epitaxial gallium containing crystal with a release layer, but it would be recognized that other crystals and materials can also be processed. Such crystals and materials include, but are not limited to, GaN, AN, InN, InGaN, AlGaN, and AlInGaN, and others for manufacture of bulk or patterned substrates.

As used herein, the term "high quality" for a particular material refers to desired film quality having a dislocation density of less than $10^5$ $cm^{-2}$, but there can be others that are recited herein, and outside of the present specification recognized by one of ordinary skill in the art. Of course, one of ordinary skill in the art would recognize other variations, modifications, and alternatives.

In a specific embodiment, a photonic-crystal light emitting diode device includes a semiconductor active layer comprising a gallium species and a nitrogen species. In a specific embodiment, the semiconductor active layer is characterized by a peak emission wavelength λ and an active layer surface dislocation density below about $10^5$ cm$^{-2}$. The device also has a semiconductor n-type layer comprising a gallium species and a nitrogen species, and an n-type surface dislocation density below about $10^5$ cm$^{-2}$, a semiconductor p-type layer comprising a gallium species and a nitrogen species, and a p-type surface dislocation density below about $10^5$ cm$^{-2}$, an electrical contact coupled to the semiconductor n-type layer, and a reflective electrical contact coupled to at least either or both the semiconductor p-type layer and the semiconductor n-type layer. In a preferred embodiment, the device has one or more photonic crystals configured within one or more regions provided by at least either the semiconductor active layer, the semiconductor n-type layer, or the semiconductor p-type layer. In a specific embodiment, one or more of the photonic crystals has a mean nearest-neighbor, center-to-center separation between about 10 nm and about 1000 nm between a first feature and a second feature (e.g., first hole and second hole, first region and second region) having a refractive-index variation in the region between the first feature and the second feature. In a specific embodiment, one or more of the photonic crystals has one or more side walls having an angle between about 60 degrees and about 90 degrees with respect to a top surface of the one or more regions.

In an alternative specific embodiment, the present invention provides a method of making a photonic-crystal light emitting diode. The method includes providing a high quality nitride crystal comprising a base nitride crystal and a release layer. In a specific embodiment, the high quality nitride crystal comprises a gallium species and a nitrogen species and having a surface dislocation density below $10^5$ cm$^2$. The method forms an n-type semiconductor layer comprising a gallium species and a nitrogen species, a semiconductor active layer comprising a gallium species and a nitrogen species characterized by a peak light emission wavelength, and a p-type semiconductor layer comprising a gallium species and a nitrogen species overlying the high quality nitride crystal to form a multilayered structure. In a specific embodiment, the method also includes forming a reflective electrical contact coupled to at least one of the p-type and n-type layers and separating the base nitride crystal from the multilayered structure to expose one or more regions of the n-type semiconductor layer. In a preferred embodiment, the method patterns at least one of exposed regions of the n-type layer to form a photonic crystal structure, with sidewall angles of between about 60 degrees and about 90 degrees with respect to a surface of the n-type layer and a mean nearest-neighbor, center-to-center separation between a first feature and a second feature between about 10 nm and about 1000 nm.

Benefits are achieved over pre-existing techniques using the present invention. In particular, the present invention provides a method and device using a release layer for manufacture of high quality films such as such as GaN, AN, InN, InGaN, and AlInGaN and others. In a specific embodiment, the present method and device use techniques that are relatively simple and cost effective. Depending upon the embodiment, the present apparatus and method can be manufactured using conventional materials and/or methods according to one of ordinary skill in the art. Depending upon the embodiment, one or more of these benefits may be achieved. These and other benefits may be described throughout the present specification and more particularly below.

The present invention achieves these benefits and others in the context of known process technology. However, a further understanding of the nature and advantages of the present invention may be realized by reference to the latter portions of the specification and attached drawings.

BRIEF DESCRIPTION OF THE DRAWINGS

FIG. 1 is a simplified diagram of a device structure according to an embodiment of the present invention;

FIG. 2 is a simplified diagram of an alternative device structure according to an embodiment of the present invention;

FIG. 3 is a simplified diagram of yet an alternative device structure according to an embodiment of the present invention;

FIG. 4 is a simplified diagram of still an alternative device structure according to an embodiment of the present invention;

FIG. 5 is a simplified diagram illustrating a separation method according to an embodiment of the present invention;

FIG. 6 is a simplified diagram of a device structure including a contact structure according to an embodiment of the present invention;

FIG. 7 is a simplified diagram of a device structure including a photoresist layer according to an embodiment of the present invention;

FIG. 8 is a simplified diagram of a device structure including patterning according to an embodiment of the present invention;

FIG. 9 is a simplified diagram of a device structure including nano-imprint lithography according to an embodiment of the present invention;

FIG. 10 is a simplified diagram of a device structure including etching of a patterned layer according to an embodiment of the present invention; and FIG. 11 is a simplified diagram illustrating four examples of a photonic crystal structure according to an embodiment of the present invention

DETAILED DESCRIPTION OF THE INVENTION

According to the present invention, techniques generally related to manufacture of devices are provided. More particularly, the present invention provides a method and device using photonic crystals or the like in combination with optical devices composed of a gallium-containing nitride crystal, but there can be others. More specifically, embodiments of the invention include techniques for fabricating a light emitting diode device using bulk gallium nitride containing materials and the like. Merely by way of example, the invention can be applied to applications such as optoelectronic devices, and the like. In other embodiments, the present invention provides a method of manufacture using a high quality epitaxial gallium containing crystal with a release layer, but it would be recognized that other crystals and materials can also be processed. Such crystals and materials include, but are not limited to, GaN, AlN, InN, InGaN, AlGaN, and AlInGaN, and others for manufacture of bulk or patterned substrates. Merely by way of example, the invention can be applied to applications such as optoelectronic devices, and the like. For clarity, and consistent with ordinary usage in the art, unless otherwise specified, the term "wavelength" as used herein refers to the wavelength of radiation propagating in air and may be denoted by the symbol λ. In addition, the term "photonic crystal" will be used to refer to structures wherein there is variation in the refractive index on a length scale from about 10 nm to about 1000 nm, but may be others. The photonic crystal may comprise a simple crystalline lattice, a complex crystalline lattice, a quasicrystalline pattern, or a liquid quasicrystalline pattern, or combinations of these. A photonic quasicrystal may lack translational or simple rotational symmetry but may possess long-range rotational order and may provide similar or superior benefits within the instant invention as compared to a true crystalline photonic lattice. Of course, there can be other variations, modifications, and alternatives.

Referring to FIG. 1, in one set of embodiments the starting point for the present invention is a substrate consisting essentially of a high quality nitride crystal with a release layer, as disclosed in U.S. Provisional Patent Application No. 61/091, 591, entitled, "Nitride crystal with release layer, method of making, and method of use," which is hereby incorporated by reference in its entirety. The nitride crystal comprises nitrogen and has a surface dislocation density below $10^5$ cm$^{-2}$. The nitride crystal or wafer may comprise $Al_xIn_yGa_{1-x-y}N$, where $0 \leq x, y, x+y \leq 1$. In one specific embodiment, the nitride crystal comprises GaN. In a preferred embodiment, the nitride crystal is substantially free of low-angle grain boundaries, or tilt boundaries, over a length scale of at least 3 millimeters. The nitride crystal has a release layer with an optical absorption coefficient greater than 1000 cm$^{-1}$ at at least one wavelength where the base crystal underlying the release layer is substantially transparent, with an optical absorption coefficient less than 50 cm$^{-1}$, and may further comprise a high quality epitaxial layer, which also has a surface dislocation density below $10^5$ cm$^{-2}$. The release layer may be etched under conditions where the nitride base crystal and the high quality epitaxial layer are not.

The substrate may have a large-surface orientation within ten degrees, within five degrees, within two degrees, within one degree, within 0.5 degree, or within 0.2 degree of (0 0 0 1), (0 0 0 –1), {1 –1 0 0}, {1 1 –2 0}, {1 –1 0±1}, {1 –1 0±2}, {1 –1 0±3}, {2 0 –2±1}, or {1 1 –2 2}. In one specific embodiment, the substrate has a semipolar large-surface orientation, which may be designated by (hkil) Bravais-Miller indices, where i=–(h+k), l is nonzero and at least one of h and k are nonzero. The substrate may have a dislocation density below $10^4$ cm$^{-2}$, below $10^3$ cm$^{-2}$, or below $10^2$ cm$^{-2}$. The nitride base crystal or wafer may have an optical absorption coefficient below 100 cm$^{-1}$, below 50 cm$^{-1}$ or below 5 cm$^{-1}$ at wavelengths between about 465 nm and about 700 nm. The nitride base crystal may have an optical absorption coefficient below 100 cm$^{-1}$, below 50 cm$^{-1}$ or below 5 cm$^{-1}$ at wavelengths between about 700 nm and about 3077 nm and at wavelengths between about 3333 nm and about 6667 nm.

In a preferred embodiment, the release layer comprises heavily cobalt-doped GaN, has a high crystal quality, and is substantially black, with an optical absorption coefficient greater than 1000 cm$^{-1}$ or greater than 5000 cm$^{-1}$ across the visible spectrum, including the range between about 465 nm and about 700 nm. The release layer is between about 0.05 micron and about 50 microns thick and has a temperature stability approximately the same as the underlying base crystal and exhibits minimal strain with respect to the underlying base crystal.

The nitride crystal may further comprise a high quality epitaxial layer on top of the release layer. In some embodiments the high quality layer is doped, for example, with Si or O to form n-type material, with a dopant concentration between about $10^{17}$ cm$^{-3}$ and $10^{20}$ cm$^{-3}$.

If it is not already present in the surface region of the substrate, an n-type $Al_uIn_vGa_{1-u-v}N$ layer, where $0 \leq u, v, u+v \leq 1$, is deposited on the substrate. The carrier concentration may lie in the range between about $10^{17}$ cm$^{-3}$ and $10^{20}$ cm$^{-3}$. The deposition may be performed using metalorganic chemical vapor deposition (MOCVD) or molecular beam epitaxy (MBE).

For example, the substrate is placed on a susceptor in an MOCVD reactor. After closing, evacuating, and back-filling the reactor to atmospheric pressure, the susceptor is heated to a temperature between about 1000 and about 1200 degrees Celsius in the presence of a nitrogen-containing gas. In one specific embodiment, the susceptor is heated to approximately 1185 degrees Celsius under flowing ammonia. A flow of a gallium-containing metalorganic precursor, such as trimethylgallium (TMG) or triethylgallium (TEG) is initiated, in a carrier gas, at a total rate between approximately 5 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 12000. A flow of disilane in a carrier gas, with a flow rate of between about 0.1 and 10 sccm, is initiated.

In some embodiments, an Al-rich AlGaN layer is incorporated into the structure as an etch-stop layer. The etch-stop layer may be 25-100 nm thick and may have an Al/Ga ratio between about 0.1 and 0.2, and may be deposited below or within the n-type $Al_uIn_vGa_{1-u-v}N$ layer.

Following deposition of the n-type $Al_uIn_vGa_{1-u-v}N$ layer for a predetermined period of time, so as to achieve a predetermined thickness, an active layer is deposited. The active layer may comprise a single quantum well or a multiple quantum well, with 2-10 quantum wells. The quantum wells may comprise InGaN wells and GaN barrier layers. In other embodiments, the well layers and barrier layers comprise $Al_wIn_xGa_{1-w-x}N$ and $Al_yIn_zGa_{1-y-z}N$, respectively, where $0 \leq w, x, y, z, w+x, y+z \leq 1$, where w<u, y and/or x>v, z so that the bandgap of the well layer(s) is less than that of the barrier layer(s) and the n-type layer. The well layers and barrier layers may each have a thickness between about 1 nm and about 20 nm. In another embodiment, the active layer comprises a double heterostructure, with an InGaN or $Al_wIn_xGa_{1-w-x}N$ layer about 20 nm to about 500 nm thick surrounded by GaN or $Al_yIn_zGa_{1-y-z}N$ layers, where w<u, y and/or x>v, z. The composition and structure of the active layer are chosen to provide light emission at a preselected wavelength. The active layer may be left undoped (or unintentionally doped) or may be doped n-type or p-type.

In some embodiments, an electron blocking layer is deposited next. The electron-blocking layer may comprise $Al_sIn_tGa_{1-s-t}N$, where $0 \leq s, t, s+t \leq 1$, with a higher bandgap than the active layer, and may be doped p-type. In one specific embodiment, the electron blocking layer comprises AlGaN. In another embodiment, the electron blocking layer comprises an AlGaN/GaN multiquantum barrier (MQB), comprising alternating layers of AlGaN and GaN, each with a thickness between about 0.2 nm and about 5 nm.

Next, a p-type doped $Al_qIn_rGa_{1-q-r}N$, where $0 \leq q, r, q+r \leq 1$, layer is deposited above the active layer. The p-type layer may be doped with Mg, to a level between about $10^{17}$ cm$^{-3}$ and $10^{21}$ cm$^{-3}$, and may have a thickness between about 5 nm and about 500 nm. The outermost 1-30 nm of the p-type layer may be doped more heavily than the rest of the layer, so as to enable an improved electrical contact.

In a specific embodiment, a tunnel junction and another n-type layer are deposited on top of the p-type layer. Other variations may also exist according to a specific embodiment.

The semiconductor layers have the same crystallographic orientation, to within about two degrees, as the substrate, have a very high crystalline quality, comprise nitrogen, and have a surface dislocation density below $10^5$ cm$^{-2}$. The semiconductor layers may have a dislocation density below $10^4$ cm$^{-2}$, below $10^3$ cm$^2$, or below $10^2$ cm$^{-2}$. In some embodiments, the semiconductor layers are substantially transparent, with an optical absorption coefficient below 100 cm$^{-1}$, below 50 cm$^{-1}$ or below 5 cm$^{-1}$ at wavelengths between about 700 nm and about 3077 nm and at wavelengths between about 3333 nm and about 6667 nm. In a preferred embodiment, the semiconductor layers are substantially free of low-angle grain boundaries, or tilt boundaries, over a length scale of at least 3 millimeters.

In a specific embodiment, the semiconductor layers have an orientation within five degrees of m-plane and the FWHM of the 1-100 x-ray rocking curve of the top surface is below 300 arc sec, below 100 arc sec, or below 50 arc sec. In another specific embodiment, the semiconductor layers have an orientation within five degrees of a-plane and the FWHM of the 11-20 x-ray rocking curve of the top surface is below 300 arc sec, below 100 arc sec, or below 50 arc sec. In yet another specific embodiment, the semiconductor layers have an orientation within five degrees of a semi-polar orientation selected from {1 −1 0±1}, {1 −1 0±2}, {1 −1 0±3}, {2 0 −2±1}, or {1 1 −2±2} and the FWHM of the lowest-order semipolar symmetric x-ray rocking curve of the top surface is below 300 arc sec, below 100 arc sec, or below 50 arc sec. In another specific embodiment, the semiconductor layers have an orientation within five degrees of (0001) c-plane and the FWHM of the 0002 x-ray rocking curve of the top surface is below 300 arc sec, below 100 arc sec, or below 50 arc sec. In still another specific embodiment, the semiconductor layers have an orientation within five degrees of (000-1) c-plane and the FWHM of the 000-2 x-ray rocking curve of the top surface is below 300 arc sec, below 100 arc sec, or below 50 arc sec.

In a preferred embodiment, the total thickness of the semiconductor layers, as measured between the removal layer and the outermost surface of the p-type layer or of the tunnel junction plus second n-type layer, if the latter are present, is between approximately 0.2 micron and 25 microns. In a specific embodiment, the total thickness of the semiconductor layers, as measured between the release layer and the outermost surface of the p-type layer, is between approximately 0.5 micron and 5 microns.

A reflective electrical contact, with a reflectivity greater than about 70%, is then deposited on the p-type semiconductor layer or on the second n-type layer above a tunnel junction, if it is present. In another embodiment, the reflective electrical contact is placed on the n-type side of the device structure. In a preferred embodiment, the reflectivity of the reflective electrical contact is greater than 80% or greater than 90%. The reflective electrical contact may comprise at least one of silver, gold, aluminum, nickel, platinum, rhodium, palladium, chromium, or the like. The reflective electrical contact may be deposited by thermal evaporation, electron beam evaporation, sputtering, or another suitable technique. In a preferred embodiment, the reflective electrical contact serves as the p-type electrode for the photonic-crystal LED. In another embodiment, the reflective electrical contact serves as an n-type electrode for the photonic-crystal LED.

In some embodiments, as shown in FIG. 2, the reflective electrical contact comprises a two-component mirror/p-electrode including a discontinuous p-electrode and a reflective mirror layer. The discontinuous p-electrode is optimized as an electrical contact and can be made, for example, of a nickel/gold or a platinum/gold stack where the nickel or platinum is about 20 to 200 nm thick and the gold is about 100 nm to 1 micron thick. In one suitable embodiment, the discontinuous p-electrode is a gridded electrode having grid openings of between about 1 micron and 0.1 cm on a side. The reflective mirror layer may comprise at least one of silver, gold, aluminum, platinum, rhodium, palladium, chromium, or the like, and is deposited over the p-type later and over the gridded p-electrode. Preferably, the mirror layer is deposited after any annealing processing of the discontinuous p-electrode to reduce interdiffusion. Optionally, a diffusion barrier layer such as nickel, rhodium, platinum, palladium, iridium, ruthenium, rhenium, tungsten, molybdenum, niobium, tantalum, or $MC_xN_yO_z$ (where M includes a metallic element such as aluminum, boron, silicon, titanium, vanadium, chromium, yttrium, zirconium, lanthanum, or a rare earth metal, and x, y, z are each between 0 and 3) is disposed between the discontinuous p-electrode and the mirror layer. Rather than a grid configuration, the discontinuous p-electrode can be arranged as an array of dots, rectangles, circles, or the like. The separation between the p-electrode array elements is preferably between about 1 micron and 0.1 cm. The use of a reflective metal p-electrode or combination of reflective mirror layer and discontinuous electrode enables fabrication of large area photonic-crystal light emitting diodes without necessitating lateral carrier transport through p-doped layers over large distances.

In another set of embodiments, as illustrated in FIG. 3, the reflective metallic electrical contact further comprises a semitransparent current-spreading layer. The current-spreading layer may comprise at least one of nickel oxide (NiO), nickel oxide/gold (NiO/Au), NiO/Ag, indium tin oxide (ITO), p-type zinc oxide (ZnO), ruthenium oxide ($RuO_2$), or the like. The current-spreading layer facilitates electrical contact to the p-type GaN layer, for example, ohmic or quasi-ohmic behavior. To minimize light absorption in the semi-transparent current-spreading layer, this layer has a thickness which is preferably between about 1 nm and about 10 nm, with more than 70% light transmission. The reflective electrical contact may further comprise a transparent dielectric disposed on a portion of the semitransparent current-spreading layer. The transparent dielectric may comprise at least one of $TiO_2$, $Ta_2O_5$, $ZrO_2$, $SiO_2$, $SiO_x$, $SiN_x$, $Si_3N_4$, or $SiO_xN_y$. The transparent dielectric may be a quarter-wave thick, that is, have a thickness approximately equal to one-quarter of the peak emission wavelength divided by the refractive index. The transparent dielectric includes open areas in which an electrical contact material is disposed. The electrical contact material may comprise at least one of nickel (Ni), nickel oxide (NiO), titanium-tungsten/gold (Ti—W/Au). In a preferred embodiment, the electrical contact material does not extend over the transparent dielectric. A reflective mirror layer is disposed over the transparent dielectric and the electrical contact material and electrically interconnects the electrical contact material in the various grid openings. The reflective mirror layer also cooperates with the transparent dielectric to define a reflector for reflecting light generated in the active layer. Further variations of the reflective metallic contact are described in U.S. Pat. No. 7,119,372, which is hereby incorporated by reference in its entirety.

In some embodiments, n-type contacts are placed on the same side of the device as the p-type contacts, as shown in FIG. 4. Vias are etched through the reflective metallic electrical contact, the p-type layer and the active layer, to expose portions of the n-type layer. The walls of the vias are coated with a via insulating layer comprising a dielectric, such as at least one of $SiO_2$, $SiO_x$, $SiN_x$, $Si_3N_4$, or $SiO_xN_y$. The inner portions of the via insulating layer are then coated with a suitable metal to form a discontinuous n-type electrode. The composition of the n-type electrode may comprise at least one of Ti, Al, and Au, or a stack thereof.

The wafer, comprising the LED structure, may be separated into one or more discrete dies, as shown in FIG. 5. For example, the backside of the wafer may be mechanically or laser scribed and then cleaved to form one or more discrete dies. At least one die may be flip-chip bonded to a submount or to a metal substrate. The submount may comprise silicon, aluminum nitride, CuW, aluminum oxide, another ceramic, or the like. In some embodiments, the p-type electrical contact is attached to interconnect metallization on the submount or to the metal substrate by means of a solder joint. The solder joint may comprise at least one of In, PbSn, AuSn, and SnAuCu. The solder joint may be formed by gold plating the back of the reflective electrical contact, evaporating Sn onto the gold layer, flipping the die and placing it in contact with a Au-coated submount, and heating to a temperature of about 280 degrees Celsius. Pressure may be placed on the joint to assist in forming a robust bond. The die may be additionally bonded to the submount or metal substrate by at least one of epoxy and wax.

The semiconductor structure, comprising the n-type layer, the active layer, the p-type layer, and the reflective electrical contact, may be separated from the nitride base crystal, or at least from the portion of the nitride base crystal still attached to the die. The removal may be effected by laser liftoff. The release layer may be illuminated by laser radiation at a wavelength at which it has an optical absorption coefficient greater than 1000 $cm^{-1}$ and the base crystal is substantially transparent, with an optical absorption coefficient less than 50 $cm^{-1}$. In one set of embodiments, the removal layer is illuminated by laser radiation through the nitride base crystal. Separation may be performed at a temperature above the melting point of the metal produced by decomposition, e.g., above about 30 degrees Celsius in the case of gallium metal.

After separation of the high quality epitaxial layer from the nitride base crystal, any residual gallium, indium, or other metal or nitride on the newly exposed back surface of the high quality epitaxial layer may be removed by treatment with at least one of hydrogen peroxide, an alkali hydroxide, tetramethylammonium hydroxide, an ammonium salt of a rare-earth nitrate, perchloric acid, sulfuric acid, nitric acid, acetic acid, hydrochloric acid, and hydrofluoric acid. The back side of the high quality epitaxial layer may be further cleaned or damage removed by dry-etching in at least one of Ar, $Cl_2$, and $BCl_3$, by techniques such as chemically-assisted ion beam etching (CAIBE), inductively-coupled plasma (ICP) etching, or reactive ion etching (RIE). The back side of the high quality epitaxial layer may be further treated by chemical mechanical polishing.

In some embodiments, traces of the release layer may remain after laser liftoff or etching from the edges of the release layer. Residual release layer material may be removed by chemical etching or by photoelectrochemical etching, illuminating the back side of the high quality epitaxial layer with radiation at a wavelength at which the release layer has an optical absorption coefficient greater than 1000 $cm^{-1}$ and the high quality epitaxial layer is substantially transparent, with an optical absorption coefficient less than 50 $cm^{-1}$.

In some embodiments, a n-type contact is deposited on the freshly-exposed backside of the n-type layer, as shown in FIG. 6. The composition of the n-type electrode may comprise at least one of Ti, Al, and Au, or a stack thereof. The n-contact may comprise a solder pad and may further comprise a current-spreading pattern, such as lines emanating from the solder pad, a grid pattern, a transparent conductive oxide such as indium tin oxide, or the like.

In one set of embodiments, illustrated in FIGS. 7 and 8, a mask with a predetermined lattice constant may be formed by holographic photolithography. In order to spread a photoresist cost-effectively over the separated dies, the flip-chipped LEDs may be placed in a submount carrier and a photoresist template may be placed over the submounts, as shown in FIG. 7. The photoresist template may have cutouts in the shape of the dies, with a gap of less than 1 mm, less than 0.2 mm, less than 0.1 mm, or less than 0.05 mm, between the edges of the cutouts and the dies. The flip-chipped dies may have a net height that is constant to within 50 microns, 20 microns, 10 microns, 5 microns, 2 microns, or 1 micron, so that the height difference between the photoresist template and an individual die is less than about 50 microns, less than about 20 microns, less than about 10 microns, less than about 5 microns, less than about 2 microns, or less than about 1 micron. A photoresist may them be dispensed onto the surface formed by the tops of the dies and the photoresist template and applied by spin-coating. Suitable examples of the photoresist are Shipley SPR-3001, AZ-1518, and KMR-747. In some embodiments, an additional thin film may be deposited on the backside of the dies prior to deposition of the photoresist.

Referring to FIG. 8, the photoresist may be developed by exposure to one or more expanded laser beams incident at a preselected angle. After an exposure at one position, the photoresist may be rotated by 90 degrees or by 60 degrees and/or by 120 degrees and exposed again. Upon washing with a suitable developer [for example, AZ-400K], a square or triangular mask with a predetermined periodicity is formed. The periodicity, or lattice constant of the photonic lattice, may be controlled by changing the wavelength of the laser and the incidence angle during the exposure. In one specific embodiment, a He—Cd laser, operating at a wavelength of 325 nm, is used to expose the photoresist. In one specific embodiment, the photoresist is rotated by 60 degrees and/or 120 degrees and the wavelength and incident angle are left unchanged, so as to produce a triangular lattice. In another specific embodiment, the photoresist is rotated by 90 degrees and the wavelength and incident angle are left unchanged, so as to produce a square lattice. The lattice constant of the photonic crystal is chosen to be between about 10 nm and about 1000 nm for efficient extraction of light. In some embodiments, the lattice constant of the photonic crystal is chosen to be between about 0.75 and about 2 times $k/n$, where n is the index of refraction at the peak emission wavelength. In one specific embodiment, the lattice constant of the photonic crystal structure is between about 1 and about 1.3 times $\lambda/n$. For example, in the case of a GaN-based light emitting diode with a peak emission wavelength of about 450 nm, the lattice constant of the photonic crystal may be about 200 nm. In the case of a triangular lattice or a square lattice, the mean nearest-neighbor, center-to-center separation between the features in the photonic crystal responsible for the refractive-index variation within the region of the photonic crystal, may be equal to the lattice constant of the photonic crystal.

In another embodiment, the mask with a predetermined lattice constant is formed by nanoimprint lithography, as shown in FIG. 9. To fabricate a nanoimprint master, a photoresist may be applied to a nanoimprint substrate. The nanoimprint substrate may constitute a silicon wafer with a 6-nm-thick $SiO_2$ coating. In other embodiments, the nanoimprint substrate may comprise at least one of quartz, fused silica, sapphire, silicon carbide, and diamond. A diamond substrate may be fabricated by chemical vapor deposition (CVD) or other suitable techniques. The photoresist may be exposed at at least two incident angles, as described above, to form a patterned photoresist on the silicon wafer. In another embodiment, the photoresist for the nanoimprint master is patterned by electron-beam lithography rather than by holographic lithography. In a specific embodiment, electron-beam lithography is used to form an Archimedean lattice pattern. The Archimedean lattice may enable superior control of the light emission pattern, as described by David et al. [Appl. Phys. Lett. 88, 073510 (2006)]. In another set of embodiments, electron-beam lithography is used to form a quasicrystal pattern. In one specific embodiment, the quasicrystal pattern is a Penrose or Penrose-tiled quasicrystal. In another embodiment, the quasicrystal pattern is a Fibonacci quasicrystal. In some embodiments, the photonic crystal has one or more defects, including the photonic-crystal analogue of vacancies, interstitials, dislocations, twins, and grain boundaries. The photonic crystal pattern may have two-fold, three-fold, four-fold, five-fold, six-fold, eight-fold, ten-fold, or twelve-fold rotational symmetry, and possibly others. In another specific embodiment, electron-beam lithography is used to fabricate at least two photonic crystal structures in the photoresist that differ from one another by at least one of their crystal structures, lattice constants, mean nearest-neighbor center-to-center distances, or fill factors.

Two consecutive etching treatments, for example, by reactive ion etching, may transfer the photonic crystal pattern from the photoresist to the $SiO_2$ layer and then into the silicon wafer or other nanoimprint substrate. The final depth of the pattern in the silicon wafer or other nanoimprint substrate surface may be between about 100 nm and about 500 nm. In some embodiments, a different dry etch chemistry is selected to etch the nanoimprint substrate than is used to etch the photoresist and/or a $SiO_2$ layer. Next, a photoresist layer may be deposited onto the flip-chipped GaN substrates. One example of a suitable photoresist for this process is Nanonex NXR-1010. The photoresist is then imprinted by the silicon master at a predetermined temperature and pressure. In one specific embodiment, the temperature is about 130 degrees Celsius and the pressure is about 300 pounds per square inch. The thin layer of polymer left in the bottom of hollows produced by the imprinting process may then be etched away by performing reactive ion etching with $O_2$.

Referring to FIG. 10, holes constituting a photonic lattice may then be etched into at least half the exposed surface of the n-type layer. The etching conditions are selected so as to maintain relatively straight sidewalls, with an angle θ with respect to the surface between about 60 degrees and about 90 degrees. In a preferred set of embodiments, the sidewall angle is between about 75 degrees and about 90 degrees or between about 80 degrees and about 90 degrees. In some embodiments, the holes are produced by reactive ion etching with $Cl_2$.

Referring to FIG. 11, the photonic lattice may constitute a triangular (a) or square (b) lattice, in which case the mean nearest-neighbor, center-to-center separation between a first feature and a second feature having a refractive-index variation (e.g., holes) may be equal to the lattice constant of the photonic lattice. In a specific embodiment, a type of Archimedean lattice as shown in (c), the lattice constant may be greater than the mean nearest-neighbor, center-to-center separation between a first feature and a second feature. In another specific embodiment, as shown in (d), the photonic lattice may be a quasicrystal, where no lattice constant may be defined but the mean nearest-neighbor, center-to-center separation between a first feature and a second feature may be estimated by inspection of the structure.

The fill factor of the photonic lattice, that is, the ratio of the open area of the holes comprising the photonic lattice to the total surface area of the photonic lattice, is adjusted to a predetermined level by varying the thickness and exposure of the photoresist so as to maximize the light extraction or adjust the emission angle of the light emitting diode. In some embodiments, the fill factor is between about 0.1 and about 0.5. In a preferred embodiment, the fill factor of the photonic crystal is between about 0.27 and about 0.38.

The depth of the holes constituting the photonic crystal is adjusted to a predetermined level by varying the etch conditions and etch time so as to maximize the light extraction or adjust the emission angle of the light emitting diode. In some embodiments, the holes have an average depth between about 10% of the lattice constant of the photonic crystal and about 95% of the thickness of the semiconductor n-type layer.

The thickness of the semiconductor layers underlying the photonic crystal is adjusted to a predetermined level by varying the growth times and growth conditions for the epitaxial semiconductor layers. In some embodiments, a total thickness characterizes the semiconductor active layer, n-type layer, and the p-type layer that is greater than the depth of the holes by less than $5\lambda/n$; and is uniform to within approximately $\pm\lambda/(4n)$, where n is an index of refraction at the peak emission wavelength characterizing the total thickness of the semiconductor active layer, n-type layer, and the p-type layer. In some embodiments, a total thickness characterizes the semiconductor active layer, n-type layer, and the p-type layer that is greater than the depth of the holes by less than $3\lambda/n$ and is uniform to within approximately $\pm\lambda/(8n)$.

In embodiments where more than one distinct photonic crystal structure is desired on different regions of the outermost semiconductor layer in the light emitting diode structure, one region may be covered while the other is being etched, and vice versa. In this way, the depth of the holes comprising the photonic crystal structure may differ from one region of the device to another.

Other methods besides laser liftoff may be employed to effect separation of the semiconductor layers from the nitride base crystal. For example, CrN may be employed as a release layer and may be removed by wet etching after flip chip bonding of the device structures to a submount.

In other embodiments, separation of the semiconductor layers from the nitride base crystal is effected using bandgap-selective etching. An epitaxial layer comprising indium and nitrogen may be deposited on the nitride base crystal as a release layer. The layer may comprise $In_yGa_{1-y}N$, where $0 \leq y \leq 1$. The layer may comprise an InGaN/GaN superlattice or an InGaN/InGaN superlattice, where alternating InGaN layer have a different composition. The release layer may have a thickness between about 25 nm and about 500 nm. In a specific embodiment, the release layer comprises an $In_{0.04}Ga_{0.96}N/In_{0.09}Ga_{0.91}N$ superlattice, with 3-8 periods and a period between about 30 and about 50 nm. In a preferred embodiment, the epitaxial release layer has the same crystallographic orientation, to within about two degrees, as the substrate, has a very high crystalline quality, comprises nitrogen, and has a surface dislocation density below $10^5$ $cm^{-2}$. The epitaxial release layer may have a dislocation density below $10^4$ $cm^{-2}$, below $10^3$ $cm^2$, or below $10^2$ $cm^{-2}$.

Other methods besides dry etching may be employed to form the holes that constitute the photonic lattice. For example, holes may be formed in the masked n-type layer by photoelectrochemical etching. For example, the masked surface of the n-type layer may be immersed in an electrolyte solution. The solution may comprise KOH, at a concentration between about 0.001 and about 10 moles per liter. The solution may further comprise an oxidizing agent, such as $K_2S_2O_8$, at a concentration between about 0.001 and about 10 moles per liter. In other embodiments, the solution may comprise an acid, such as at least one of HCl, $H_2SO_4$, $HNO_3$, HF, $H_3PO_4$, $CH_3COOH$, and $HClO_4$, at a concentration between about 0.001 and about 10 moles per liter. An electrical bias may be applied to the n-type layer with respect to a Pt counterelectrode, at a voltage between about 0.001 and 4 volts. The surface of the n-type layer may be illuminated by ultraviolet light. The ultraviolet light may have a wavelength less than about 365 nm and be emitted from a Xe or Hg—Xe lamp at a power between about 100 watts and about 5000 watts.

In a specific embodiment, the light extraction efficiency of the photonic-crystal light emitting diode may be greater than 50%. In a preferred embodiment, the light extraction efficiency of the photonic-crystal light emitting diode is greater than 75%. The light extraction efficiency may be defined as the external quantum efficiency divided by the internal quantum efficiency. The external quantum efficiency may be measured by methods that are well known in the art. Rigorous determination of the internal quantum efficiency may be more difficult. However, the internal quantum efficiency may be measured with sufficient accuracy as the ratio of the external quantum efficiency at room temperature to the external quantum efficiency at low temperature, for example, below 10 degrees Kelvin.

In some embodiments, at least one photonic-crystal light emitting diode is packaged along with at least one phosphor, as described in U.S. patent application 61/086,139, entitled "White light devices using non-polar or semipolar gallium containing materials and phosphors," which is hereby incorporated by reference in its entirety. In other embodiments, at least one photonic-crystal light emitting diode is co-packaged along with at least one additional light emitting diode, as described in U.S. patent application 61/076,596, entitled "Copackaging configurations for nonpolar GaN and/or semipolar GaN LEDs," which is hereby incorporated by reference in its entirety.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A photonic-crystal light emitting diode, comprising:
   a semiconductor active layer comprising a gallium species and a nitrogen species, the semiconductor active layer characterized by a peak emission wavelength λ and an active layer surface dislocation density below about $10^5$ $cm^{-2}$;
   a semiconductor n-type layer comprising a gallium species and a nitrogen species, and an n-type surface dislocation density below about $10^5$ $cm^2$;
   a semiconductor p-type layer comprising a gallium species and a nitrogen species, and a p-type surface dislocation density below about $10^5$ $cm^2$;
   an electrical contact coupled to the semiconductor n-type layer;
   a reflective electrical contact coupled to at least either or both the semiconductor p-type layer and the semiconductor n-type layer; and
   one or more photonic crystals configured within one or more regions provided by at least the semiconductor active layer, the semiconductor n-type layer, or the semiconductor p-type layer, the one or more of the photonic crystals having a mean nearest-neighbor, center-to-center separation between a first feature and a second feature having a refractive index variation between about 10 nm and about 1000 nm and one or more of the first feature and the second feature having one or more side walls having an angle between about 60 degrees and about 90 degrees with respect to a top surface of the one or more regions;
   wherein the semiconductor active layer, the semiconductor n-type layer, and the semiconductor p-type layer, is characterized by a total thickness that is greater than the depth of the hole regions by less than 5λ/n and is uniform to within approximately ±λ/(4n), where n is an index of refraction at the peak emission wavelength characterizing the total thickness of the semiconductor active layer, the semiconductor n-type layer, and the semiconductor p-type layer.

2. The light emitting diode of claim 1 wherein the one or more photonic crystals occupy more than one half of at least one surface of the one or more regions.

3. The light emitting diode of claim 1 wherein the one or more photonic crystals are provided overlying more than one half of at least one surface of the one or more regions.

4. The light emitting diode of claim 1 wherein the one or more photonic crystals occupy more than one half of at least one planar region within at least the semiconductor active layer, semiconductor n-type layer, or semiconductor p-type layer.

5. The light emitting diode of claim 1 wherein the one or more photonic crystals are provided overlying more than one half of at least one planar region within at least the semiconductor active layer, semiconductor n-type layer, or semiconductor p-type layer.

6. The light emitting diode of claim 1, wherein the active layer surface dislocation density is below $10^4$ $cm^{-2}$, the n-type layer surface dislocation density is below $10^4$ $cm^{-2}$, and the p-type layer surface dislocation density is below $10^4$ $cm^{-2}$.

7. The light emitting diode of claim 6, wherein the active layer surface dislocation density is below $10^3$ $cm^{-2}$, the n-type layer surface dislocation density is below $10^3$ $cm^{-2}$, and the p-type layer surface dislocation density is below $10^3$ $cm^{-2}$.

8. The light emitting diode of claim 7, wherein the active layer surface dislocation density is below $10^2$ cm-2, the n-type layer surface dislocation density is below $10^2$ $cm^{-2}$, and the p-type layer surface dislocation density is below $10^2$ $cm^{-2}$.

9. The light emitting diode of claim 1, wherein the mean nearest-neighbor, center-to-center separation between a first feature and a second feature having a refractive-index variation in the region between the first feature and the second feature of the photonic crystal structure is between about 0.75 and about 2 times λ/n, where n is the index of refraction at the peak emission wavelength.

10. The light emitting diode of claim 9, wherein the mean nearest-neighbor, center-to-center separation between a first feature and a second feature having a refractive-index variation in the region between the first feature and the second feature of the photonic crystal structure is between about 1 and about 1.3 times π/n.

11. The light emitting diode of claim 1, wherein at least one of the photonic crystals has a lattice configured as a triangular lattice or a square lattice.

12. The light emitting diode of claim 1, wherein at least one of the photonic crystals has an Archimedean lattice configuration.

13. The light emitting diode of claim 1, wherein at least one of the photonic crystals is a Penrose or Penrose-tiled quasicrystal.

14. The light emitting diode of claim 1, wherein at least one of the photonic crystals comprises at least one defect, the defect comprising at least one of a vacancy, an interstitial, a dislocation, a twin, and a grain boundary.

15. The light emitting diode of claim 1, wherein at least one of the photonic crystals is configured with a fill factor between about 0.1 and about 0.5.

16. The light emitting diode of claim 15, wherein the fill factor is between about 0.27 and about 0.38.

17. The light emitting diode of claim 1, wherein at least one of the photonic crystals comprises a plurality of hole regions, each of the hole regions having a depth between about 10% of the lattice constant of the photonic crystal and about 95% of a total thickness of one or more of a group comprising the semiconductor active layer, the semiconductor n-type layer, and the semiconductor p-type layer.

18. The light emitting diode of claim 1, wherein the semiconductor active layer, the n-type layer, and the p-type layer are characterized by a total thickness that is greater than the depth of the hole regions by less than $3\lambda/n$ and is substantially uniform to within approximately $\pm\lambda/(8n)$.

19. The light emitting diode of claim 1, wherein two or more of the photonic crystals differ from one another by at least one characteristic selected from a crystal structure, a mean nearest-neighbor, center-to-center separation between a first feature and a second feature having a refractive-index variation in the region between the first feature and the second feature, a fill factor, or a hole depth.

20. The light emitting diode of claim 1, wherein the semiconductor active layer, the n-type layer, and the p-type layer are characterized by a surface orientation within 5 degrees of $\{1 -1\ 0\ 0\}$.

21. The light emitting diode of claim 1, wherein the semiconductor active layer, the n-type layer, and the p-type layer are characterized by a surface orientation within 5 degrees of $\{1\ 1 -2\ 0\}$.

22. The light emitting diode of claim 1, wherein the semiconductor active layer, the n-type layer, and the p-type layer are characterized by a surface orientation within 5 degrees of $\{1 -1\ 0\pm1\}$.

23. The light emitting diode of claim 1, wherein the semiconductor active layer, the n-type layer, and the p-type layer are characterized by a surface orientation within 5 degrees of $\{1 -1\ 0\pm2\}$.

24. The light emitting diode of claim 1, wherein the semiconductor active layer, the n-type layer, and the p-type layer are characterized by a surface orientation within 5 degrees of $\{1 -1\ 0\pm3\}$.

25. The light emitting diode of claim 1, wherein the semiconductor active layer, the n-type layer, and the p-type layer are characterized by a surface orientation within 5 degrees of $\{1\ 1 -2\pm2\}$.

26. The light emitting diode of claim 1, wherein the semiconductor active layer, the n-type layer, and the p-type layer are characterized by a surface orientation within 5 degrees of $\{2\ 0 -2\pm1\}$.

27. The light emitting diode of claim 1, wherein the semiconductor active layer, the n-type layer, and the p-type layer are characterized by a surface orientation within 5 degrees of $(0\ 0\ 0\ 1)$.

28. The light emitting diode of claim 1, wherein the semiconductor active layer, the n-type layer, and the p-type layer are characterized by a surface orientation within 5 degrees of $(0\ 0\ 0 -1)$.

29. The light emitting diode of claim 1 wherein the one or more photonic crystals are characterized by one or more spatial regions having a different refractive index.

30. The light emitting diode of claim 1, wherein the semiconductor active layer comprises $Al_w In_x Ga_{1-w-x} N$, where $0 \leq w, x, w+x \leq 1$.

31. The light emitting diode of claim 1, wherein the semiconductor n-type layer comprising $Al_u In_v Ga_{1-u-v} N$, where $0 \leq u, v, u+v \leq 1$.

32. The light emitting diode of claim 1, wherein the semiconductor p-type layer comprising $Al_q In_r Ga_{1-q-r} N$, where $0 \leq q, r, q+r \leq 1$.

33. The light emitting diode of claim 1, comprising an electron-blocking layer.

34. The light emitting diode of claim 33, wherein the electron blocking layer comprises $Al_s In_t Ga_{1-s-t} N$, where $0 \leq s, t, s+t \leq 1$.

* * * * *